US012775362B2

(12) United States Patent
Bok et al.

(10) Patent No.: US 12,775,362 B2
(45) **Date of Patent: *Oct. 27, 2026**

(54) ELECTRONIC DEVICE WITH DISPLAY LAYER AND SENSING LAYER

(71) Applicant: Samsung Display Co., Ltd., Yongin-Si (KR)

(72) Inventors: Seung-Lyong Bok, Hwaseong-si (KR); Kicheol Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/000,970

(22) Filed: Dec. 24, 2024

(65) Prior Publication Data

US 2025/0130678 A1 Apr. 24, 2025

Related U.S. Application Data

(63) Continuation of application No. 18/532,106, filed on Dec. 7, 2023, now Pat. No. 12,210,713, which is a (Continued)

(30) Foreign Application Priority Data

Jan. 10, 2022 (KR) ........................ 10-2022-0003647

(51) Int. Cl.
*G06F 3/044* (2006.01)
*H10K 59/40* (2023.01)

(52) U.S. Cl.
CPC ........... *G06F 3/0446* (2019.05); *H10K 59/40* (2023.02)

(58) Field of Classification Search
None
See application file for complete search history.

(56) References Cited

U.S. PATENT DOCUMENTS

| | | | |
|---|---|---|---|
| 8,330,352 | B2 | 12/2012 | Sung et al. |
| 9,645,694 | B2 | 5/2017 | Iwami et al. |

(Continued)

FOREIGN PATENT DOCUMENTS

| | | |
|---|---|---|
| KR | 10-1634468 | 6/2016 |
| KR | 10-1709631 | 2/2017 |

(Continued)

*Primary Examiner* — Sarvesh J Nadkarni
(74) *Attorney, Agent, or Firm* — F. CHAU & ASSOCIATES, LLC

(57) ABSTRACT

An electronic device includes: a sensor layer on a display layer, the sensor layer including a sensing electrode, the display layer including: first pixels, second pixels spaced apart from the first pixels in a first direction, and third pixels arranged with the first pixels along a second direction, the second pixels are arranged along the second direction, and two adjacent second pixels form a first pixel group, the two second pixels are spaced apart by a first distance in the second direction, and the first pixel group is spaced apart by a second distance in the second direction from a second pixel group, the sensing electrode includes a first sensing electrode and a second sensing electrode each including sensing patterns each sensing pattern including a first portion adjacent to the first and third pixels, and a second portion extending in the first direction between the first and second pixel group.

19 Claims, 18 Drawing Sheets

Related U.S. Application Data continuation of application No. 17/961,115, filed on Oct. 6, 2022, now Pat. No. 11,861,126.

(56) References Cited

U.S. PATENT DOCUMENTS

| | | | | |
|---|---|---|---|---|
| 9,753,595 | B2 | 9/2017 | Kim et al. | |
| 9,817,527 | B2 | 11/2017 | Bok | |
| 9,877,385 | B2 | 1/2018 | Nakamura et al. | |
| 10,386,984 | B2 | 8/2019 | Ishizaki et al. | |
| 10,411,078 | B2 | 9/2019 | Lu et al. | |
| 10,788,918 | B2 | 9/2020 | Kim et al. | |
| 11,086,439 | B2 * | 8/2021 | Ding | H10K 59/131 |
| 11,188,165 | B2 | 11/2021 | Oh et al. | |
| 11,469,276 | B2 | 10/2022 | Jeon et al. | |
| 11,861,126 | B2 | 1/2024 | Bok et al. | |
| 2019/0073066 | A1 | 3/2019 | Ishizaki et al. | |
| 2019/0369784 | A1 * | 12/2019 | Yao | H10K 59/122 |
| 2020/0363905 | A1 * | 11/2020 | Jo | G06F 3/0448 |
| 2021/0097919 | A1 * | 4/2021 | Chai | G02B 27/1053 |
| 2021/0191556 | A1 * | 6/2021 | Lee | H10K 59/40 |
| 2021/0200379 | A1 | 7/2021 | Youk et al. | |
| 2021/0200386 | A1 * | 7/2021 | Park | H10K 59/873 |
| 2023/0105728 | A1 * | 4/2023 | Park | H10K 59/121 345/173 |
| 2023/0221824 | A1 | 7/2023 | Bok et al. | |
| 2024/0111389 | A1 | 4/2024 | Bok et al. | |

FOREIGN PATENT DOCUMENTS

| | | |
|---|---|---|
| KR | 10-2019-0023359 | 3/2019 |
| KR | 10-2020-0136549 A | 12/2020 |
| KR | 10-2021-0032946 | 3/2021 |
| KR | 10-2021-0085912 | 7/2021 |

* cited by examiner

ELECTRONIC DEVICE WITH DISPLAY LAYER AND SENSING LAYER

CROSS-REFERENCE TO RELATED APPLICATIONS

This U.S. non-provisional patent application is a continuation of U.S. patent application Ser. No. 18/532,106 filed on Dec. 7, 2023, which is a continuation of U.S. patent application Ser. No. 17/961,115 filed on Oct. 6, 2022, now U.S. Pat. No. 11,861,126, which claims priority under 35 U.S.C. § 119 to Korean Patent Application No. 10-2022-0003647, filed on Jan. 10, 2022, the disclosures of which are incorporated by reference herein in their entireties.

TECHNICAL FIELD

The present disclosure relates to an electronic device with enhanced sensing performance.

DISCUSSION OF RELATED ART

An organic light-emitting electronic device features organic pixels that are capable of producing their own illumination when exposed to an electric current. An organic light-emitting electronic device typically includes two electrodes and a light-emitting layer disposed therebetween. When electrons injected from one electrode and holes injected from the other electrode combine in the light-emitting layer, excitons are formed, and when the excitons release energy, light is emitted.

A plurality of light-emitting layers, which respectively emit red, green, and blue light, may achieve a full-color display, and in this case the light-emitting layers may have a stripe structure in which light-emitting layers emitting the same color light are arranged in a line. For example, a red light-emitting layer may form one of the stripes of the stripe structure and a green light-emitting layer may form another one of the stripes of the stripe structure.

SUMMARY

The present disclosure provides an electronic device with enhanced sensing performance.

An embodiment of the inventive concept provides an electronic device including: a display layer; and a sensor layer disposed on the display layer, and including a sensing electrode, wherein the display layer includes: a plurality of first pixels, a plurality of second pixels spaced apart from the first pixels in a first direction, and a plurality of third pixels alternately arranged with the first pixels along a second direction, the second pixels are arranged along the second direction, and two adjacent second pixels form a first pixel group, the two adjacent second pixels are spaced apart by a first distance in the second direction, and the first pixel group is spaced apart by a second distance in the second direction from a second pixel group adjacent thereto, the second distance being greater than the first distance, the sensing electrode includes a first sensing electrode and a second sensing electrode each including a plurality of sensing patterns, and the sensing patterns each include a first portion adjacent to the first pixels and the third pixels, and a second portion extending, when viewed on a plane, in the first direction between the first pixel group and the second pixel group.

When viewed on the plane, the sensing electrode does not overlap the first pixels, the second pixels, and the third pixels.

The second portion is provided in plural, and the second portions are spaced apart from each other in the first direction, and are disposed between the first pixel group and the second pixel group.

At least one of the second portions extends in the second direction, and includes a first sub portion, a second sub portion, and a third sub portion arranged in the first direction, and a first pattern is formed in the second sub portion.

The first pattern is formed in the center of the second sub portion.

A second pattern is formed in the first sub portion, and a third pattern is formed in the third sub portion, and, when viewed in the second direction, the first pattern, the second pattern, and the third pattern overlap each other.

A second pattern is formed in the first sub portion, and a third pattern is formed in the third sub portion, and, when viewed in the second direction, portions of the first pattern, the second pattern, and the third pattern do not overlap each other.

An edge of the second sub portion in which the first pattern is formed has a predetermined angle.

The first pattern is formed on one side of the second sub portion.

A width of the first portion is equal to a width of the second portion.

The first portion has a first width, and the second portion has a second width greater than the first width.

When viewed on the plane, the first pixel group does not overlap the sensing electrode.

The sensor layer further includes a dummy electrode adjacent to the sensing electrode, and the dummy electrode is electrically connected to a ground electrode.

The first sensing electrode further includes at least one connection pattern which connects two adjacent sensing patterns of the sensing patterns, and the second sensing electrode includes first sensing portions, and at least one second sensing portion which connects two adjacent first sensing portions of the first sensing portions, the connection pattern and the second sensing portion being disposed on different layers.

A plurality of openings are provided in the first portion, and the first portion is electrically connected to the second portion.

When viewed on the plane, the sensing electrode is disposed between the two adjacent second pixels, and further includes a protrusion protruding in the second direction.

The sensing electrode further includes a second sensing electrode disposed on a layer different from a layer on which the first portion and the second portion are disposed, and when viewed on the plane, an opening overlapping the second sensing electrode is provided in the first portion.

An embodiment of the inventive concept provides, an electronic device including: a display layer; and a sensor layer disposed on the display layer, and including a sensing electrode, wherein the display layer includes: a plurality of first pixels, a plurality of second pixels spaced apart from the first pixels in a first direction, and each of the second pixels is spaced apart from second pixels adjacent thereto by a first distance and a second distance, respectively, the second distance being greater than the first distance, and a plurality of third pixels alternately arranged with the first pixels along a second direction, and the sensing electrode includes a first portion adjacent to the first pixels and the second pixels, and a second portion extending, when viewed on a plane, in the first direction between two second pixels spaced apart from each other by the second distance.

The second portion is provided in plural, and the second portions are spaced apart from each other in the second direction.

The first portion has a first width, and the second portion has a second width greater than the first width.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Figure 1:
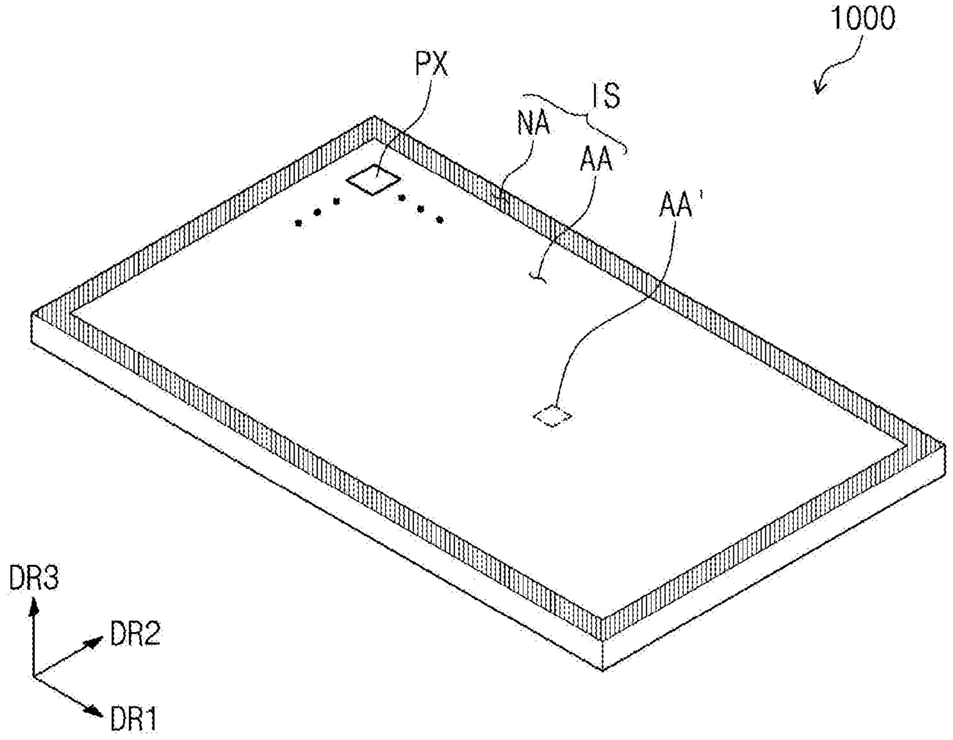
FIG. 1 is a perspective view of an electronic device according to an embodiment of the inventive concept.

In this specification, when a component (or region, layer, portion, etc.) is referred to as "on", "connected", or "coupled" to another component, it may mean that the component is placed/connected/coupled directly on the other component or a third component can be disposed between them.

The same reference numerals or symbols may refer to the same elements in this specification. In addition, in the drawings, thicknesses, ratios, and dimensions of components may be exaggerated for effective description of the technical content. "And/or" may include all combinations of one or more of the associated elements.

Terms such as first and second may be used to describe various components, but the components should not be limited by the terms. These terms are only used for the purpose of distinguishing one component from other components. For example, a first component may be referred to as a second component, and similarly, a second component may be referred to as a first component. Singular expressions may include plural expressions unless the context clearly indicates otherwise.

In addition, terms such as "below", "lower", "above", and "upper" are used to describe the relationship between components shown in the drawings. The terms are relative concepts and are described based on the directions indicated in the drawings.

Terms such as "include" or "have" are intended to designate the presence of a feature, number, step, action, component, part, or combination thereof as described in the specification, and it should be understood that this does not preclude the possibility of the presence or addition of one or more other features, numbers, steps, operations, components, parts, or combinations thereof.

Unless otherwise defined, all terms (including technical and scientific terms) used in this specification have the same meaning as commonly understood by one of ordinary skill in the art to which this invention belongs. In addition, terms such as terms defined in commonly used dictionaries should be interpreted as having a meaning consistent with their meaning in the context of the related technology, and should not be interpreted in an ideal or overly formal sense unless explicitly defined here.

Hereinafter, embodiments of the inventive concept will be described with reference to the drawings.

Figure 2:
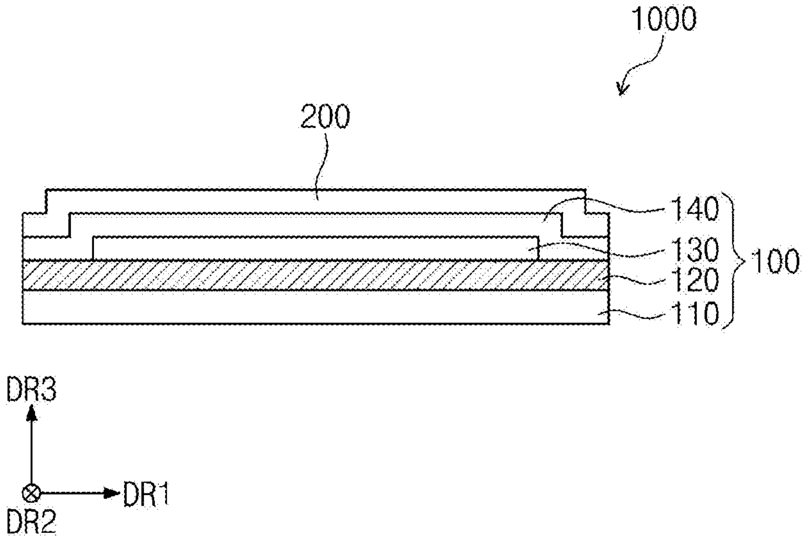
FIG. 2 is a cross-sectional view of an electronic device according to an embodiment of the inventive concept.

FIG. 1 is a perspective view of an electronic device according to an embodiment of the inventive concept, and FIG. 2 is a cross-sectional view of an electronic device according to an embodiment of the inventive concept.

Referring to FIGS. 1 and 2, an electronic device 1000 may have a configuration that generates an image. The electronic device 1000 may be a light-emitting electronic device or a light-receiving electronic device. For example, the electronic device 1000 may be any one among an organic light-emitting electronic device, a quantum dot light-emitting electronic device, a micro light emitting diode (LED) electronic device, a nano LED electronic device, a liquid crystal electronic device, an electrophoretic electronic device, an electrowetting electronic device, and a micro-electromechanical (MEMS) electronic device, and is not specifically limited thereto.

The electronic device 1000 may include a display layer 100 and a sensor layer 200 disposed on the display layer 100.

The electronic device 1000 may display an image through a display surface IS. The display surface IS may be parallel to a plane formed by a first direction DR1 and a second direction DR2. The display surface IS may include an active region AA and a peripheral region NA. Pixels PX may be disposed in the active region AA, and may not be disposed in the peripheral region NA. The peripheral region NA may be formed along the edge of the display surface IS. The peripheral region NA may surround the active region AA. In an embodiment of the inventive concept, the peripheral region NA may be omitted, or may be disposed only on one side or fewer than all sides of the active region AA.

The normal direction of the display surface IS, in other words, the thickness direction of the electronic device 1000 may be indicated by a third direction DR3. The front surface (or upper surface) and the rear surface (or lower surface) of each layer or unit to be described below may be determined based on the third direction DR3.

In an embodiment of the inventive concept, the electronic device 1000 provided with a flat display surface IS is illustrated, but is not limited thereto. The electronic device 1000 may include a curved display surface or a three-dimensional display surface. The three-dimensional display surface may include a plurality of display regions that indicate directions different from each other.

The electronic device 1000 may include the display layer 100 and the sensor layer 200.

The display layer 100 according to an embodiment of the inventive concept may be a light-emitting display layer, but is not specifically limited thereto. For example, the display layer 100 may include an organic light-emitting display layer, a quantum dot display layer, a micro LED display layer, a nano LED display layer, or the like. A light-emitting layer of the organic light-emitting display layer may include an organic light-emitting material. A light-emitting layer of the quantum dot display layer may include quantum dots, quantum rods, etc. A light-emitting layer of the micro LED display layer may include micro LEDs. A light-emitting layer of the nano LED display layer may include nano LEDs.

The display layer 100 may include a base layer 110, a circuit layer 120, a light-emitting element layer 130, and an encapsulation layer 140. The base layer 110, the circuit layer 120, the light-emitting element layer 130, and the encapsulation layer 140 may be stacked in this order.

The base layer 110 may be a member that provides a surface on which the circuit layer 120 is disposed. The base layer 110 may be a glass substrate, a metal substrate, or a polymer substrate. However, an embodiment of the inventive concept is not limited thereto, and the base layer 110 may be an inorganic layer, an organic layer, or a composite material layer.

The base layer 110 may have a multi-layered structure. For example, the base layer 110 may include a first synthetic resin layer, a silicon oxide ($SiO_x$) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

The first and second synthetic resin layers may each include a polyimide-based resin. In addition, the first and second synthetic resin layers may each include at least one of an acryl-based resin, a methacryl-based resin, a polyisoprene-based resin, a vinyl-based resin, an epoxy-based resin, a urethane-based resin, a cellulose-based resin, a siloxane-based resin, a polyamide-based, or a perylene-based resin. In the present disclosure, "~~"-based resin may mean a resin including a functional group of "~~".

The circuit layer 120 may be disposed on the base layer 110. The circuit layer 120 may include an insulating layer, a semiconductor pattern, a conductive pattern, a signal line, etc. An insulating layer, a semiconductor layer, and a conductive layer may be formed on the base layer 110 through coating, deposition, or the like, and then, may be selectively patterned by performing a photolithography process multiple times. Thereafter, a semiconductor pattern, a conductive pattern, and a signal line included in the circuit layer 120 may be formed.

The light-emitting element layer 130 may be disposed on the circuit layer 120. The light-emitting element layer 130 may include a light-emitting element. For example, the light-emitting element layer 130 may include an organic light-emitting material, a quantum dot, a quantum rod, a micro LED, or a nano LED.

The encapsulation layer 140 may be disposed on the light-emitting element layer 130. The encapsulation layer 140 may protect the light-emitting element layer 130 from moisture, oxygen, and foreign matters such as dust particles.

The sensor layer 200 may be formed on the display layer 100 through a continuous process. In this case, it may be expressed that the sensor layer 200 is directly disposed on the display layer 100. Being directly disposed may mean that a third component is not disposed between the display layer 100 and the sensor layer 200. In other words, a separate adhesive member may not be disposed between the display layer 100 and the sensor layer 200. Alternately, the display layer 100 and the sensor layer 200 may be connected to each other through an adhesive member. The adhesive member may include a typical bonding agent or adhesive.

Figure 3:
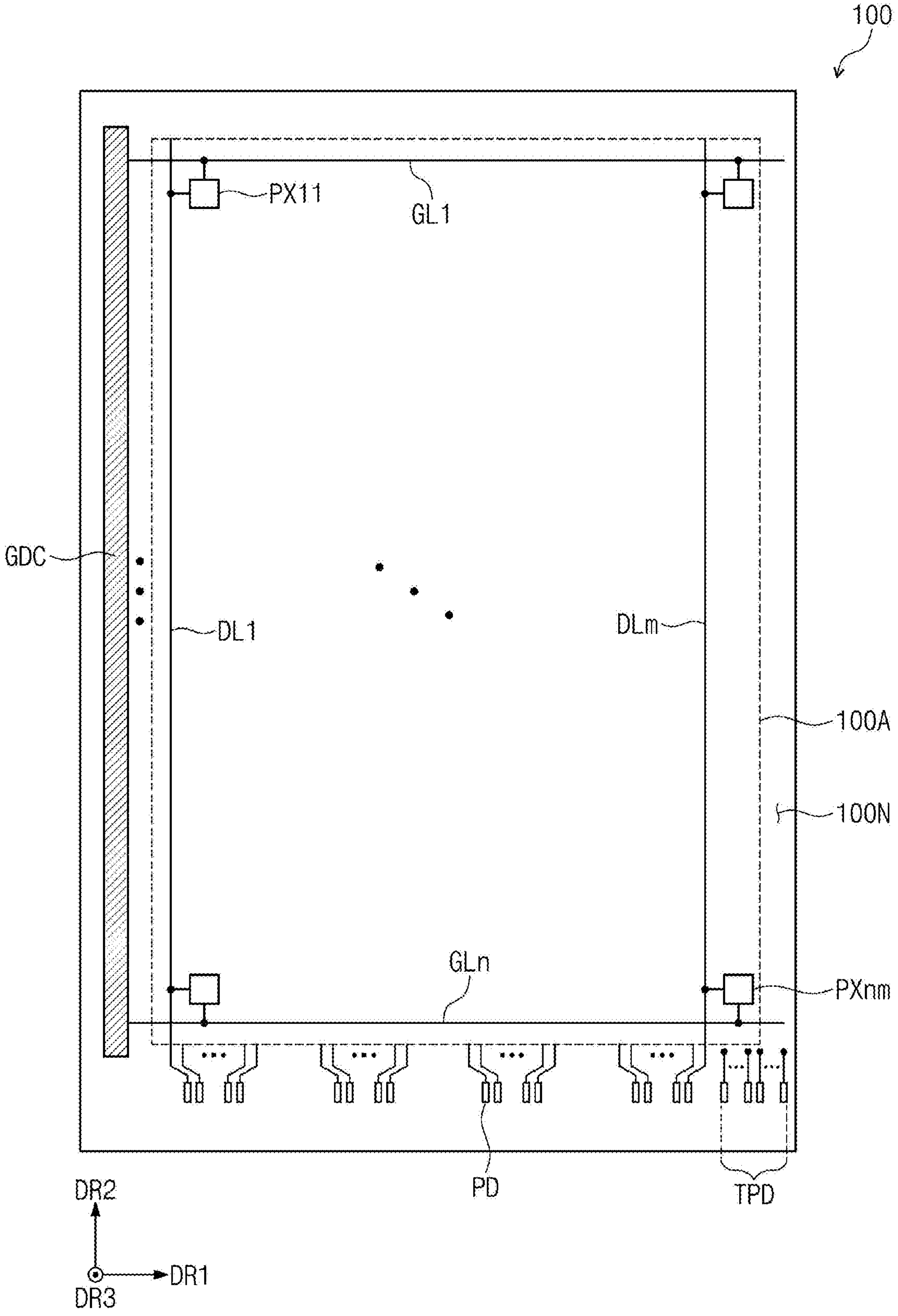
FIG. 3 is a plan view of a display layer according to an embodiment of the inventive concept.

FIG. 3 is a plan view of a display layer according to an embodiment of the inventive concept.

Referring to FIG. 3, a display layer 100 may include an active region 100A and a peripheral region 100N adjacent to the active region 100A. The active region 100A and the peripheral region 100N may be distinct from each other depending on whether a plurality of pixels PX11 to PXnm are disposed or not. The plurality of pixels PX11 to PXnm may be disposed in the active region 100A, and may not be disposed in the peripheral region 100N.

When seen on a plane, the active region 100A may overlap the active region AA (see FIG. 1) of the electronic device 1000 (see FIG. 1). The peripheral region 100N may overlap the peripheral region NA (see FIG. 1) of the electronic device 1000 (see FIG. 1).

The plurality of pixels PX11 to PXnm may be respectively connected to corresponding gate lines of a plurality of gate lines GL1 to GLn, and corresponding data lines of a plurality of data lines DLI to DLm. The plurality of pixels PX11 to PXnm may each include a pixel-driving circuit and a display element. The display layer 100 may be provided with more types of signal lines depending on the configuration of the pixel-driving circuit in each of the plurality of pixels PX11 to PXnm.

A scanning driving circuit GDC and a plurality of pads PD may be disposed in the peripheral region 100N. The scanning driving circuit GDC and circuits in the electronic device 1000 may be formed through the same process. A data driving circuit may be a partial circuit included in a driving chip, and the driving chip may be electrically connected to the plurality of pixels PX11 to PXnm through pads PD disposed in the peripheral region 100N.

The display layer 100 may further include a plurality of sensing pads TPD. The plurality of sensing pads TPD may be disposed in the peripheral region 100N. The plurality of sensing pads TPD may be electrically connected to a plurality of sensing electrodes of the sensor layer 200 (see FIG. 2), respectively.

Figure 4:
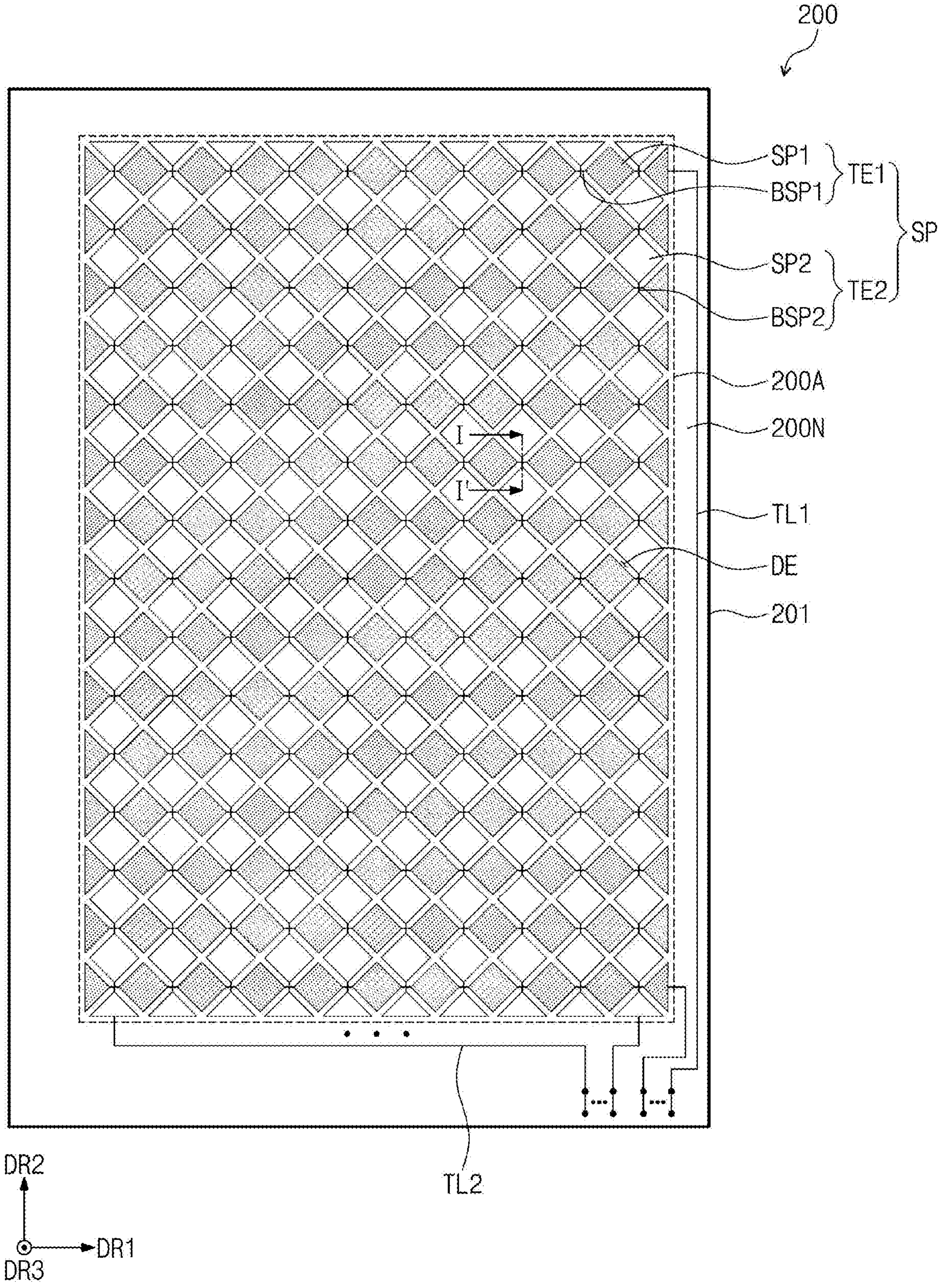
FIG. 4 is a plan view of a sensor layer according to an embodiment of the inventive concept.

FIG. 4 is a plan view of a sensor layer according to an embodiment of the inventive concept.

Referring to FIG. 4, a sensor layer 200 may include an active region 200A and a peripheral region 200N adjacent to the active region 200A. The active region 200A may be activated in response to an electric signal. The active region 200A may be a region in which an input is sensed. When seen on a plane, the active region 200A may overlap the active region 100A (see FIG. 3) of the display layer 100 (see FIG. 3). The peripheral region 200N may overlap the peripheral region 100N (see FIG. 3) of the display layer 100 (see FIG. 3).

The sensor layer 200 may include a base layer 201, a plurality of sensing electrodes SP, a plurality of sensing lines TL1 and TL2, and a dummy electrode DE. The plurality of sensing electrodes SP, and the dummy electrode DE may be disposed in the active region 200A. The plurality of sensing lines TL1 and TL2 may be disposed in the peripheral region 200N. The plurality of sensing lines TL1 and TL2 may extend from the peripheral region 200N to the active region 200A.

The base layer 201 may be an inorganic layer including any one among silicon nitride, silicon oxynitride, and silicon oxide. Alternately, the base layer 201 may be an organic layer including an epoxy resin, an acryl resin, or an imide-based resin. The base layer 201 may be directly formed on the display layer 100 (see FIG. 2).

The plurality of sensing electrodes SP may include a plurality of first sensing electrodes TE1 and a plurality of second sensing electrodes TE2. The sensor layer 200 may obtain information about an external input through a change in capacitance between the plurality of first sensing electrodes TE1 and the plurality of second sensing electrodes TE2.

The plurality of first sensing electrodes TE1 may each extend along the first direction DR1, and may be arranged along the second direction DR2. The plurality of first sensing electrodes TE1 may include a plurality of first sensing portions SP1 and a plurality of second sensing portions BSP1. The plurality of second sensing portions BSP1 may each electrically connect two first sensing portions SP1 adjacent to each other. For example, one of the second sensing portions BSP1 may be disposed between adjacent first sensing portions SP1. The plurality of first sensing portions SP1 and the plurality of second sensing portions BSP1 may have a mesh structure. The plurality of first sensing portions SP1 may be referred to as the plurality of first sensing parts SP1. The plurality of second sensing portions BSP1 may be referred to as the plurality of first connection parts BSP1.

The plurality of second sensing electrodes TE2 may each extend along the second direction DR2, and may be arranged along the first direction DR1. The plurality of second sensing electrodes TE2 may include a plurality of sensing patterns SP2 and a plurality of connection patterns BSP2. The plurality of connection patterns BSP2 may each electrically connect two sensing patterns SP2 adjacent to each other. For example, one of the connection patterns BSP2 may be disposed between adjacent sensing patterns SP2. The plurality of sensing patterns SP2 may have a mesh structure. The plurality of sensing patterns SP2 may be referred to as the plurality of sensing parts SP2. The plurality of connection patterns BSP2 may be referred to as the plurality of second connection parts BSP2.

The plurality of second sensing portions BSP1 and the plurality of connection patterns BSP2 may be disposed on different layers. The plurality of connection patterns BSP2 may be insulated from and cross the plurality of first sensing electrodes TE1. For example, the plurality of second sensing portions BSP1 may be insulated from and cross the plurality of connection patterns BSP2, respectively.

The dummy electrode DE may be disposed adjacent to the plurality of sensing electrodes SP. The dummy electrode DE may have a mesh structure.

The plurality of sensing lines TL1 and TL2 may include a plurality of first sensing lines TL1 and a plurality of second sensing lines TL2. The plurality of first sensing lines TL1 may be electrically connected to the plurality of first sensing electrodes TE1, respectively. The plurality of second sensing lines TL2 may be electrically connected to the plurality of second sensing electrodes TE2, respectively.

The plurality of first sensing lines TL1 and the plurality of second sensing lines TL2 may be electrically connected to the plurality of sensing pads TPD (see FIG. 3) through contact holes, respectively.

Figure 5:
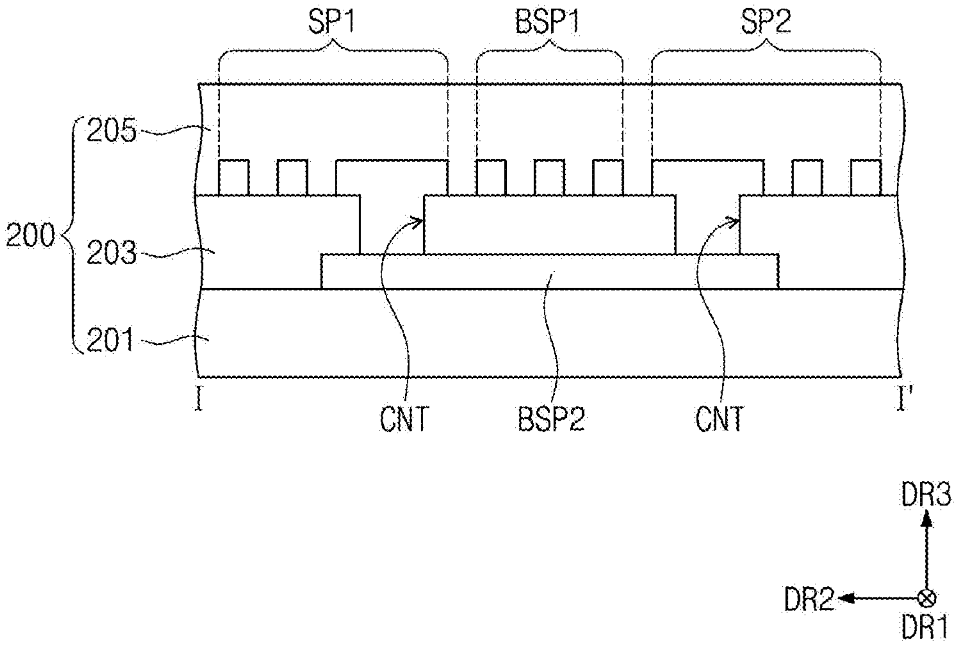
FIG. 5 is a cross-sectional view taken along I-I' of FIG. 4 according to an embodiment of the inventive concept.

FIG. 5 is a cross-sectional view taken along I-I' of FIG. 4 according to an embodiment of the inventive concept.

Referring to FIG. 5, a sensor layer 200 may include a base layer 201, a plurality of first sensing portions SP1, a plurality of second sensing portions BSP1, a plurality of sensing patterns SP2, a plurality of connection patterns BSP2, a sensing insulating layer 203, and a cover insulating layer 205. The plurality of connection patterns BSP2 may be disposed on the base layer 201. For example, the plurality of connection patterns BSP2 may directly contact an upper surface of the base layer 201. The sensing insulating layer 203 may be disposed on the plurality of connection patterns BSP2. For example, the plurality of connection patterns BSP2 may be disposed between the base layer 201 and the sensing insulating layer 203. The sensing insulating layer 203 may have a single- or multi-layered structure. The sensing insulating layer 203 may include an inorganic material, an organic material, or a composite material.

The plurality of first sensing portions SP1, the plurality of second sensing portions BSP1, and the plurality of sensing patterns SP2 may be disposed on the sensing insulating layer 203. The plurality of first sensing portions SP1, the plurality of second sensing portions BSP1, and the plurality of sensing patterns SP2 may have a mesh structure.

A plurality of contact holes CNT may be formed by penetrating the sensing insulating layer 203 in the third direction DR3. Two adjacent sensing patterns SP2 of the plurality of sensing patterns SP2 may be electrically connected to the connection patterns BSP2 through the plurality of contact holes CNT. In addition, a first sensing pattern SP1 may be electrically connected to a connection pattern BSP2 through one the plurality of contact holes CNT.

The cover insulating layer 205 may be disposed on the plurality of first sensing portions SP1, the plurality of second sensing portions BSP1, and the plurality of sensing patterns SP2. The cover insulating layer 205 may have a single- or multi-layered structure. The cover insulating layer 205 may include an inorganic material, an organic material, or a composite material.

FIG. 5 illustrates a bottom bridge structure in which the plurality of connection patterns BSP2 are disposed under the plurality of first sensing portions SP1, the plurality of second sensing portions BSP1, and the plurality of sensing patterns SP2, but an embodiment of the inventive concept is not limited thereto. For example, the sensor layer 200 may also have a top bridge structure in which the plurality of connection patterns BSP2 are disposed on the plurality of first sensing portions SP1, the plurality of second sensing portions BSP1, and the plurality of sensing patterns SP2.

Figure 6:
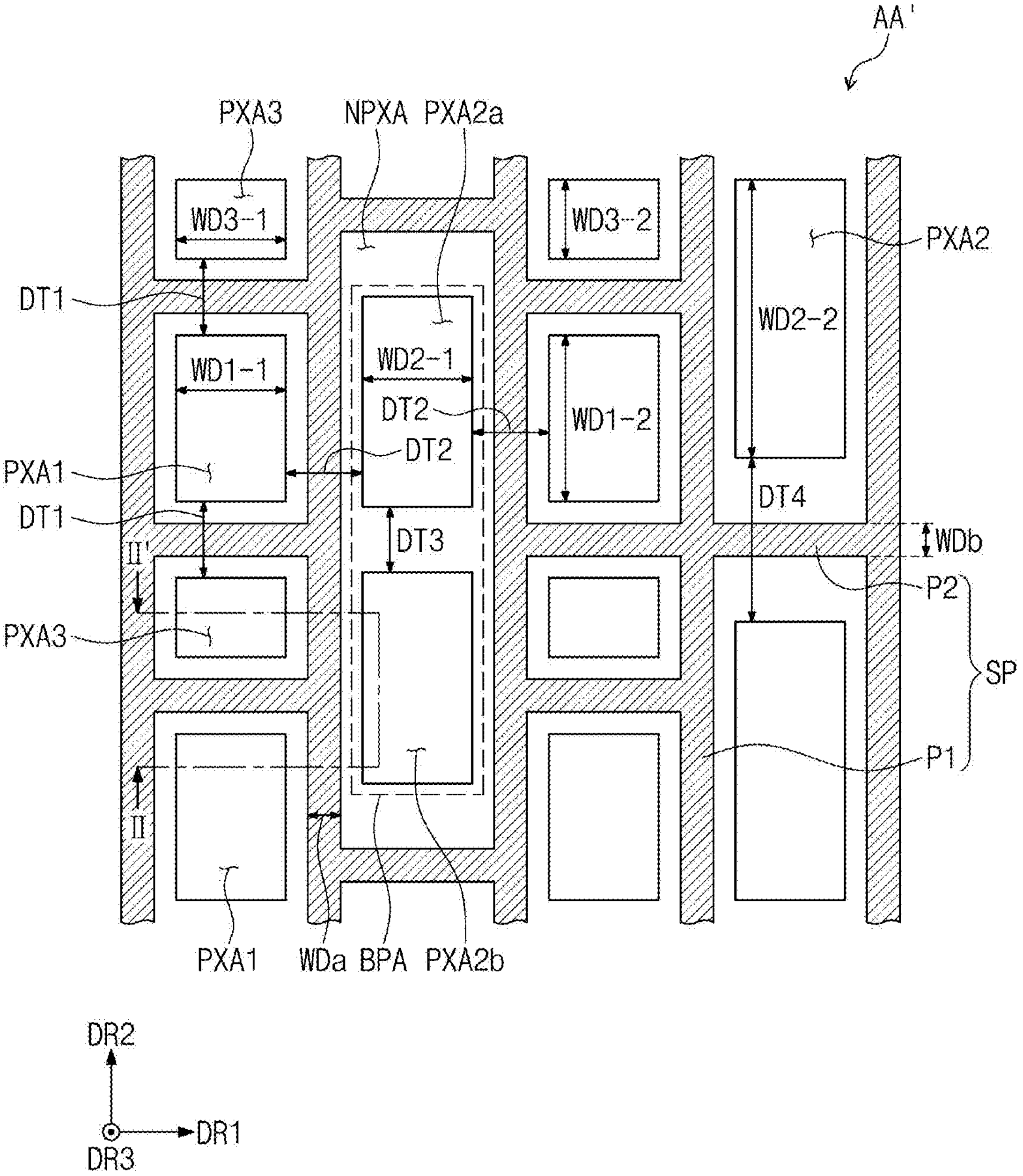
FIG. 6 is a plan view illustrating region AA' of FIG. 1 according to an embodiment of the inventive concept.

FIG. 6 is a plan view illustrating region AA' of FIG. 1 according to an embodiment of the inventive concept.

Referring to FIGS. 1 and 6, a plurality of first pixel regions PXA1, a plurality of second pixel regions PXA2, a plurality of third pixel regions PXA3, and a light-blocking region NPXA may be provided in a display layer 100 of an electronic device 1000. The display layer 100 may provide first color light through the plurality of first pixel regions PXA1, second color light through the plurality of second pixel regions PXA2, and third color light through the plurality of third pixel regions PXA3. The first color light, the second color light, and the third color light may be light of colors different from each other. For example, the first color light may be green color light, the second color light may be blue color light, and the third color light may be red color light.

A plurality of pixels PX (see FIG. 1) may include a plurality of first pixels, a plurality of second pixels, and a plurality of third pixels.

The plurality of first pixel regions PXA1 may be regions respectively corresponding to the plurality of first pixels.

The plurality of first pixel regions PXA1 may each have a first width WD1-1 extending in the first direction DR1. The first width WD1-1 may be about 31 μm to about 32 μm. For example, the first width WD1-1 may be about 31.54 μm.

The plurality of first pixel regions PXA1 may each have a second width WD1-2 extending in the second direction DR2. The second width WD1-2 may be about 39 μm to about 40 μm. For example, the second width WD1-2 may be about 39.56 μm.

The plurality of second pixel regions PXA2 may be regions respectively corresponding to the plurality of second pixels.

The plurality of second pixel regions PXA2 may each have a first width WD2-1 extending in the first direction DR1. The first width WD2-1 may be about 31 μm to about 32 μm. For example, the first width WD2-1 may be about 31.54 μm. The first width WD2-1 may be the same as the first width WD1-1.

The plurality of second pixel regions PXA2 may each have a second width WD2-2 extending in the second direction DR2. The second width WD2-2 may be about 19 μm to about 20 μm. For example, the second width WD2-2 may be about 19.44 μm. The second width WD2-2 may be larger than the second width WD1-2.

The area of each of the plurality of second pixel regions PXA2 may be greater than the area of each of the plurality of first pixel regions PXA1.

The plurality of third pixel regions PXA3 may be regions respectively corresponding to the plurality of third pixels.

The plurality of third pixel regions PXA3 may each have a first width WD3-1 extending in the first direction DR1. The first width WD3-1 may be about 27 μm to about 28 μm. For example, the first width WD3-1 may be about 27.46 μm.

The plurality of third pixel regions PXA3 may each have a second width WD3-2 extending in the second direction DR2. The second width WD3-2 may be about 65 μm to about 66 μm. For example, the second width WD3-2 may be about 65.5 μm.

The area of each of the plurality of third pixel regions PXA3 may be smaller than the area of each of the plurality of first pixel regions PXA1.

The plurality of first pixel regions PXA1 and the plurality of third pixel regions PXA3 may be alternately arranged along a first column extending in the second direction DR2.

The plurality of second pixel regions PXA2 may be arranged along a second column extending in the second direction DR2. The second column may be adjacent to the first column.

The plurality of first pixel regions PXA1 and the plurality of second pixel regions PXA2 may be alternately arranged along the first direction DR1.

The plurality of third pixel regions PXA3 and the plurality of second pixel regions PXA2 may be alternately arranged along the first direction DR1.

A first spacing DT1 may be a spacing extending in the second direction DR2 between one of the first pixel regions PXA1 and one of the third pixel regions PXA3 adjacent to each other. The first spacing DT1 may be about 19 μm to about 20 μm. For example, the first spacing DT1 may be about 18.5 μm.

The first spacing DT1 may be equal to a second spacing DT2 extending in the first direction DR1 between one first pixel region PXA1 and one second pixel region PXA2 adjacent to each other.

A first distance DT3 extending in the second direction DR2 between adjacent second pixel regions PXA2*a* and PXA2*b* may be smaller than the first spacing DT1 and the second spacing DT2.

The first distance DT3 may be about 12 μm to about 13 μm. For example, the first distance DT3 may be about 12.5 μm.

Second pixels of two adjacent second pixel regions PXA2*a* and PXA2*b* may be referred to as a pixel group BPA. A second distance DT4 extending in the second direction DR2 between adjacent pixel groups BPA may be greater than the first spacing DT1, the second spacing DT2, and the first distance DT3.

The second distance DT4 may be about 48 μm to about 49 μm. For example, the second distance DT4 may be about 48.5 μm.

A second light-emitting layer EL2 (see FIG. 7) in the second pixels of the two second pixel regions PXA2*a* and PXA2*b* according to an embodiment of the inventive concept may be formed as a single pattern. Accordingly, the light-emitting layer in the second pixel regions PXA2*a* and PXA2*b* may be deposited using a shadow mask having an opening with a size corresponding to an area of the second pixel regions PXA2*a* and PXA2*b*.

According an embodiment of the inventive concept, the light-emitting layer in adjacent second pixel regions PXA2*a* and PXA2*b* may be a single pattern, and may thus be continuous without a spacing therebetween. The distance between adjacent second pixels may be determined by the first distance DT3 between the adjacent second pixel regions PXA2*a* and PXA2*b*. In this case, since the first distance DT3 is irrespective of a shadow mask used for depositing a light-emitting layer, a shadow phenomenon in which the area of a light-emitting region is reduced due to the limitation of the shadow mask may be prevented. Accordingly, the resolution of an image generated by the display layer 100 may be improved. Accordingly, the electronic device 1000 with enhanced display performance may be provided.

The light-blocking region NPXA may be disposed adjacent to the first pixel regions PXA1, the second pixel regions PXA2, and the third pixel regions PXA3. The light-blocking region NPXA may set the boundaries between the first pixel regions PXA1, the second pixel regions PXA2, and the third pixel regions PXA3. The light-blocking region NPXA may prevent color mixing between the first pixel regions PXA1, the second pixel regions PXA2, and the third pixel regions PXA3.

The plurality of sensing electrodes SP may each include a first portion P1 and a second portion P2. The plurality of sensing electrodes SP may not overlap the plurality of first pixel regions PXA1, the plurality of second pixel regions PXA2, and the plurality of third pixel regions PXA3.

The plurality of sensing electrodes SP may each include a plurality of first sensing electrodes TE1 (see FIG. 4) and a plurality of second sensing electrodes TE2 (see FIG. 4). The plurality of first sensing electrodes TE1 (see FIG. 4) may include a plurality of first sensing portions SP1 (see FIG. 4) and a plurality of second sensing portions BSP1 (see FIG. 4). The plurality of second sensing electrodes TE2 (see FIG. 4) may include a plurality of sensing patterns SP2 (see FIG. 4) and a plurality of connection patterns BSP2 (see FIG. 4).

The plurality of first sensing portions SP1 (see FIG. 4), the plurality of second sensing portions BSP1 (see FIG. 4), and the plurality of sensing patterns SP2 (see FIG. 4) may be each composed of the first portion P1 and the second portion P2.

The first portion P1 may be disposed adjacent to the plurality of first pixel regions PXA1 and the plurality of third pixel regions PXA3. For example, the first portion P1 may be located on opposite sides of a first pixel region PXA1 and a third pixel region PXA3 that are adjacent to each other. The first portion P1 may surround the plurality of first pixel regions PXA1 and the plurality of third pixel regions PXA3.

The first portion P1 may have a first width WDa. The first width WDa may be about 3.5 μm to about 4.5 μm. For example, the first width WDa may be about 4 μm.

When seen on a plane, the second portion P2 may extend between the pixel group BPA and another adjacent pixel group BPA in the first direction DR1. The second portion P2 may be provided integrally with the first portion P1. In other words, the second portion P2 and the first portion P1 may be integrally formed.

The second portion P2 may have a second width WDb. The second width WDb may be equal to the first width WDa.

The second portion P2 may not be disposed between the second pixel regions PXA2*a* and PXA2*b* due to the first distance DT3 between the second pixel regions PXA2*a* and PXA2*b*. When seen on a plane, the pixel group BPA may not overlap the plurality of sensing electrodes SP. In other words, the second portion P2 may not be disposed between the two second pixel regions PXA2*a* and PXA2*b* of a single pixel group BPA. For example, the second portion P2 may be disposed on opposite sides of the two second pixel regions PXA2*a* and PXA2*b* of the single pixel group BPA.

Mutual capacitance between the plurality of first sensing electrodes TE1 (see FIG. 4) and the plurality of second sensing electrodes TE2 (see FIG. 4) may be about 430 fF (femtofarad) to about 440 fF. For example, the mutual capacitance may be about 434 fF. The amount of change in the mutual capacitance may be about 36 fF to about 38 fF. For example, the amount of change may be about 37 fF.

According to an embodiment of the inventive concept, the second portion P2 formed between adjacent pixel groups BPA may increase the mutual capacitance between the plurality of first sensing electrodes TE1 (see FIG. 4) and the plurality of second sensing electrodes TE2 (see FIG. 4) which are each composed of the first portion P1 and the second portion P2. Accordingly, the sensing sensitivity of the sensor layer 200 (see FIG. 1) may be improved.

According to an embodiment of the inventive concept, the electronic device 1000 may include: a display layer 100; and a sensor layer 200 disposed on the display layer 100, and including a sensing electrode SP, wherein the display layer 100 includes: a plurality of first pixels (in PXA1), a plurality of second pixels (in PXA2*a/b*) spaced apart from the first pixels (in PXA1) in a first direction DR1, and a plurality of third pixels (in PXA3) alternately arranged with the first pixels (in PXA1) along a second direction DR2, the second pixels (in PXA2*a/b*) are arranged along the second direction DR2, and two adjacent second pixels (in PXA2*a/b*) form a first pixel group BPA, the two adjacent second pixels (in PXA2*a/b*) are spaced apart by a first distance DT3 in the second direction DR2, and the first pixel group BPA is spaced apart by a second distance DT4 in the second direction DR2 from a second pixel group BPA adjacent thereto, the second distance DT4 being greater than the first distance DT3, the sensing electrode SP include a first sensing electrode TEL and a second sensing electrode TE2 each including a plurality of sensing patterns, and the sensing patterns each a first portion P1 adjacent to the first pixels (in PXA1) and the third pixels (in PXA3), and a second portion P2 extending, when viewed on a plane, in the first direction DR1 between the first pixel group BPA and the second pixel group BPA.

Figure 7:
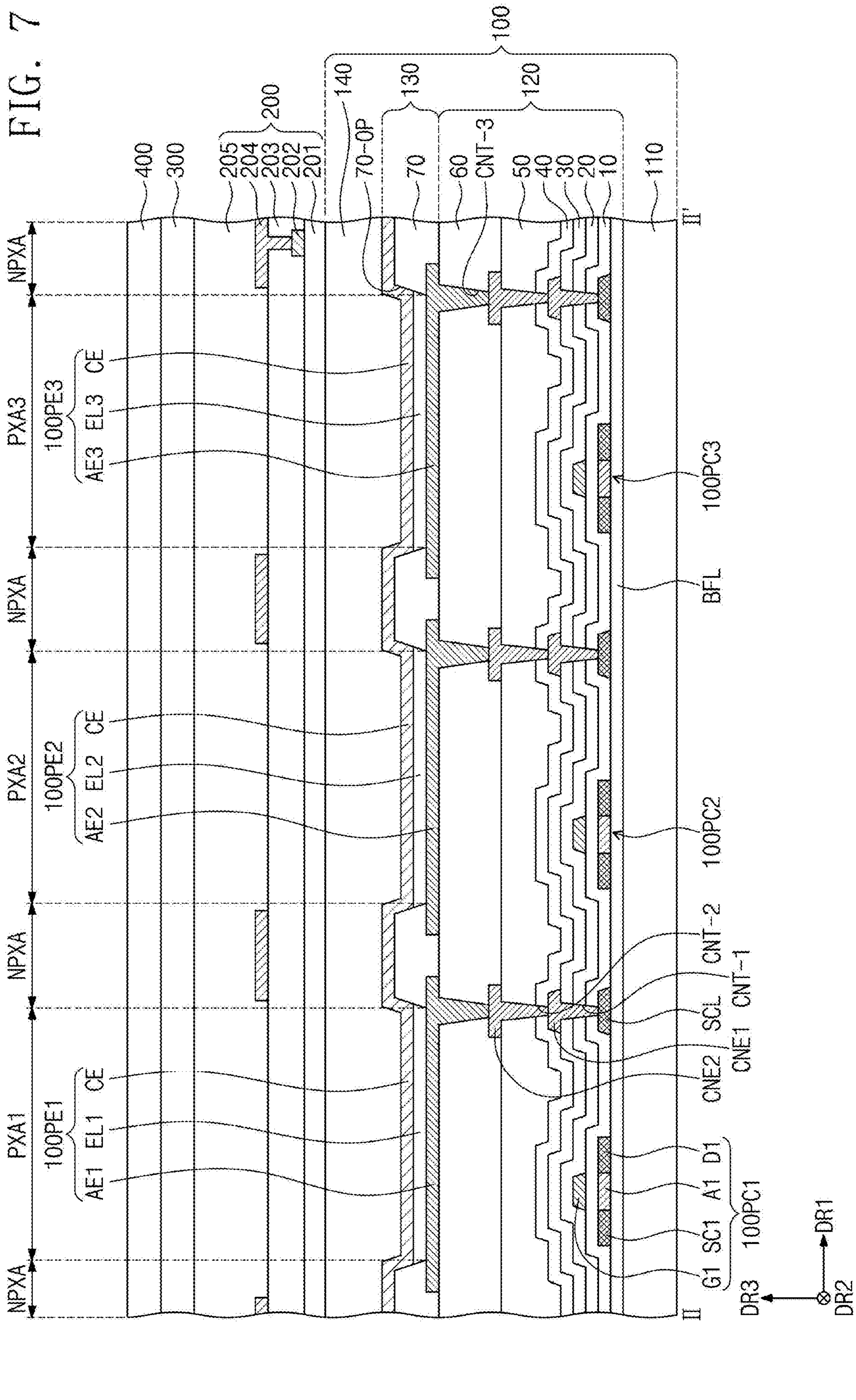
FIG. 7 is a cross-sectional view of an electronic device taken along II-II' of FIG. 6 according to an embodiment of the inventive concept.

FIG. 7 is a cross-sectional view of an electronic device taken along II-II' of FIG. 6 according to an embodiment of the inventive concept.

Referring to FIGS. 6 and 7, an electronic device 1000 (see FIG. 1) may include a display layer 100, a sensor layer 200, an anti-reflective panel 300, and a window 400.

The display layer 100 may include a base layer 110, a circuit layer 120, a light-emitting element layer 130, and an encapsulation layer 140.

The base layer 110 may be a member providing a base surface on which the circuit layer 120 is disposed. The base layer 110 may be a glass substrate, a metal substrate, a polymer substrate, or the like. However, an embodiment is not limited thereto, and the base layer 110 may be an inorganic layer, an organic layer, or a composite material layer.

The base layer 110 may have a multi-layered structure. For example, the base layer 110 may include a first synthetic resin layer, a silicon oxide ($SiO_x$) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

The first and second synthetic resin layers may each include a polyimide-based resin. In addition, the first and second synthetic resin layers may each include at least one of an acryl-based resin, a methacryl-based resin, a polyisoprene-based resin, a vinyl-based resin, an epoxy-based resin, a urethane-based resin, a cellulose-based resin, a siloxane-based resin, a polyamide-based resin, or a perylene-based resin. In the present disclosure, "~"-based resin may mean a resin including a functional group of "~~".

At least one inorganic layer is formed on an upper surface of the base layer 110. The inorganic layer may include at least one of aluminum oxide, titanium oxide, silicon oxide, silicon nitride, silicon oxynitride, zirconium oxide, or hafnium oxide. The inorganic layer may have a multi-layered structure. The multi-layered inorganic layers may constitute a barrier layer and/or a buffer layer. In the present embodiment, it is illustrated that the display layer 100 includes a buffer layer BFL.

The buffer layer BFL may enhance a bonding force between the base layer 110 and a semiconductor pattern. The buffer layer BFL may include at least one of silicon oxide, silicon nitride, or silicon oxynitride. For example, the buffer layer BFL may include a structure in which a silicon oxide layer and a silicon nitride layer are alternately stacked.

The semiconductor pattern may be disposed on the buffer layer BFL. The semiconductor pattern may include poly-silicon. However, an embodiment of the inventive concept is not limited thereto, and the semiconductor pattern may include amorphous silicon, low-temperature polycrystalline silicon, or an oxide semiconductor.

FIG. 7 only illustrates some of the semiconductor patterns, and the semiconductor patterns may be further disposed in another region. Semiconductor patterns may be arranged across pixels according to a specific rule. The semiconductor patterns may have different electrical properties depending on whether the semiconductor patterns are doped or not. The semiconductor patterns may include a first region having a higher conductivity and a second region having a lower conductivity. The first region may be doped with an N-type dopant or a P-type dopant. A P-type transistor may include a doped region doped with a P-type dopant, and an N-type transistor may include a doped region doped with an N-type dopant. The second region may be an undoped region, or a region doped at a lower concentration than that of the first region.

The first region may have a higher conductivity than the second region, and may serve as an electrode or a signal line. The second region may correspond to an active region of a transistor. In other words, a part of the semiconductor pattern may be an active region of a transistor, another part of the semiconductor pattern may be a source region or a drain region of a transistor, and still another part of the semiconductor pattern may be a connection electrode or a connection signal line.

A plurality of pixels may include a plurality of first pixels, a plurality of second pixels, and a plurality of third pixels. The plurality of pixels may each have an equivalent circuit including seven transistors, one capacitor, and a light-emitting element, and the equivalent circuit diagram of a pixel may be changed to various forms. FIG. 7 illustrates one transistor and one light-emitting element included in each pixel.

The plurality of first pixels may each include a first transistor 100PC1 and a first light-emitting element 100PE1.

The plurality of second pixels may each include a second transistor 100PC2 and a second light-emitting element 100PE2.

The plurality of third pixels may each have a third transistor 100PC3 and a third light-emitting element 100PE3.

A source region SC1, an active region A1, and a drain region D1 of each of the first transistor 100PC1, the second transistor 100PC2, and the third transistor 100PC3 may be formed from a semiconductor pattern. The source region SC1 and the drain region D1 may extend from the active region A1 in mutually opposite directions on a cross-section. FIG. 7 illustrates a part of a connection signal line SCL formed from a semiconductor pattern. Although not illustrated separately, the connection signal line SCL may be connected to the drain region D1 of the first transistor 100PC1 on a plane.

A first insulating layer 10 may be disposed on the buffer layer BFL. The first insulating layer 10 may overlap a plurality of pixels in common, and may cover a semiconductor pattern. The first insulating layer 10 may be an inorganic layer and/or an organic layer, and may have a single- or multi-layered structure. The first insulating layer 10 may include at least one of aluminum oxide, titanium oxide, silicon oxide, silicon nitride, silicon oxynitride, zirconium oxide, or hafnium oxide. In the present embodiment, the first insulating layer 10 may be a single-layered silicon oxide layer. Not only the first insulating layer 10, but also an insulating layer of the circuit layer 120 to be described later may be an inorganic layer and/or an organic layer, and may have a single- or multi-layered structure. The inorganic layer may include at least one of materials described above, but an embodiment of the inventive concept is not limited thereto.

A gate G1 of each of the first transistor 100PC1, the second transistor 100PC2, and the third transistor 100PC3 is disposed on the first insulating layer 10. The gate G1 may be a part of a metal pattern. The gate G1 overlaps the active region A1. In the process of doping a semiconductor pattern, the gate G1 may function as a mask.

A second insulating layer 20 may be disposed on the first insulating layer 10, and may cover the gate G1. The second insulating layer 20 may overlap pixels in common. The second insulating layer 20 may be an inorganic layer and/or an organic layer, and may have a single- or multi-layered structure. The second insulating layer 20 may include at least one of silicon oxide, silicon nitride, or silicon oxynitride. In the present embodiment, the second insulating layer 20 may have a multi-layered structure including a silicon oxide layer and a silicon nitride layer.

A third insulating layer 30 may be disposed on the second insulating layer 20. The third insulating layer 30 may have a single- or multi-layered structure. For example, the third insulating layer 30 may have a multi-layered structure including a silicon oxide layer and a silicon nitride layer.

A first connection electrode CNE1 may be disposed on the third insulating layer 30. The first connection electrode CNE1 may be connected to the connection signal line SCL through a contact hole CNT-1 penetrating the first, second, and third insulating layers 10, 20, and 30.

A fourth insulating layer 40 may be disposed on the third insulating layer 30. The fourth insulating layer 40 may be a single-layered silicon oxide layer. The fourth insulating layer 40 may cover a portion of the first connection electrode CNE1. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 penetrating the fourth insulating layer 40 and the fifth insulating layer 50.

A sixth insulating layer 60 may be disposed on the fifth insulating layer 50, and may cover the second connection electrode CNE2. The sixth insulating layer 60 may be an organic layer.

The light-emitting element layer 130 may be disposed on the circuit layer 120. The light-emitting element layer 130 may include a plurality of light-emitting elements, e.g., first, second and third light-emitting elements 100PE1, 100PE2, and 100PE3. For example, the light-emitting element layer 130 may include an organic light-emitting material, a quantum dot, a quantum rod, a micro LED, or a nano LED. Hereinafter, it will be described as an example that the plurality of light-emitting elements 100PE1, 100PE2, and 100PE3 are organic light-emitting elements, but an embodiment of the inventive concept is not specially limited thereto.

The first light-emitting element 100PE1 may include a first pixel electrode AE1, a first light-emitting layer EL1, and a common electrode CE.

The second light-emitting element 100PE2 may include a second pixel electrode AE2, a second light-emitting layer EL2, and the common electrode CE.

The third light-emitting element 100PE3 may include a third pixel electrode AE3, a third light-emitting layer EL3, and the common electrode CE.

The first pixel electrode AE1, the second pixel electrode AE2, and the third pixel electrode AE3 may be disposed on the sixth insulating layer 60. The first pixel electrode AE1, the second pixel electrode AE2, and the third pixel electrode AE3 may be each connected to the second connection electrode CNE2 through a contact hole CNT-3 penetrating the sixth insulating layer 60.

A pixel-defining film 70 may be disposed on the sixth insulating layer 60, and may partially cover the first pixel electrode AE1. An opening 70-OP is provided in the pixel-defining film 70. The opening 70-OP of the pixel-defining film 70 may expose at least a part of each of the first pixel electrode AE1, the second pixel electrode AE2, and the third pixel electrode AE3.

An active region 100A (see FIG. 3) may include a first pixel region PXA1, a second pixel region PXA2, a third pixel region PXA3, and a light-blocking region NPXA adjacent to the first pixel region PXA1, the second pixel region PXA2, and the third pixel region PXA3. The light-blocking region NPXA may surround the first pixel region PXA1, the second pixel region PXA2, and the third pixel region PXA3.

In the present embodiment, the first pixel region PXA1, the second pixel region PXA2, and the third pixel region PXA3 respectively correspond to partial regions of the first pixel electrode AE1, the second pixel electrode AE2, and the third pixel electrode AE3 exposed by the openings 70-OP.

The first light-emitting layer EL1 may be disposed on the first pixel electrode AE1. The second light-emitting layer EL2 may be disposed on the second pixel electrode AE2. The third light-emitting layer EL3 may be disposed on the third pixel electrode AE3. The first light-emitting layer EL1, the second light-emitting layer EL2, and the third light-emitting layer EL3 may be respectively disposed in regions corresponding to the openings 70-OP.

The common electrode CE may be disposed on the first, second and third light-emitting layers EL1, EL2 and EL3. The common electrode CE may have an integrated shape, and may be disposed in a plurality of pixels in common.

A hole control layer may be disposed between the first pixel electrode AE1 and the first light-emitting layer EL1. The hole control layer may be disposed, in common, in the first pixel region PXA1 and the light-blocking region NPXA. The hole control layer may include a hole transport layer, and may further include a hole injection layer. An electron control layer may be disposed between the first light-emitting layer EL1 and the common electrode CE. The electron control layer may include an electron transport layer, and may further include an electron injection layer. The hole control layer and the electron control layer may be formed, in common, in a plurality of pixels using an open mask.

The encapsulation layer 140 may be disposed on the light-emitting element layer 130. The encapsulation layer 140 may include an inorganic layer, but layers composing the encapsulation layer 140 are not limited thereto.

An inorganic layer of the encapsulation layer 140 may protect the light-emitting element layer 130 from moisture and oxygen. The inorganic layer may include a silicon nitride layer, a silicon oxynitride layer, a silicon oxide layer, a titanium oxide layer, an aluminum oxide layer, or the like.

The sensor layer 200 may include a base layer 201, a first conductive layer 202, a sensing insulating layer 203, a second conductive layer 204, and a cover insulating layer 205.

The base layer 201 may be an inorganic layer including at least any one of silicon nitride, silicon oxynitride, or silicon oxide. Alternatively, the base layer 201 may be an organic layer including an epoxy resin, an acryl resin, or an imide-based resin. The base layer 201 may have a single-layered structure, or a multi-layered structure in which layers are stacked along the third direction DR3.

The first conductive layer 202 and the second conductive layer 204 may each have a single-layered structure, or a multi-layered structure in which layers are stacked along the third direction DR3. The first conductive layer 202 may include a plurality of first sensing portions SP1, a plurality of second sensing portions BSP1, and a plurality of sensing patterns SP2. The second conductive layer 204 may include a plurality of connection patterns BSP2. However, this is an example, and components included in each of the first conductive layer 202 and the second conductive layer 204 according to an embodiment of the inventive concept are not limited thereto.

A conductive layer having a single-layered structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), or indium zinc tin oxide (IZTO). In addition, the transparent conductive layer may include a conductive polymer such as PEDOT, metal nano wires, graphene, or the like.

A conductive layer having a multi-layered structure may include metal layers. For example, the metal layers may have a three-layered structure of titanium/aluminum/titanium. The conductive layer having a multi-layered structure may include at least one metal layer and at least one transparent conductive layer.

At least any one of the sensing insulating layer 203 or the cover insulating layer 205 may include an inorganic film. The inorganic film may include at least one of aluminum oxide, titanium oxide, silicon oxide, silicon nitride, silicon oxynitride, zirconium oxide, or hafnium oxide.

At least any one of the sensing insulating layer 203 or the cover insulating layer 205 may include an organic film. The organic film may include at least any one among an acryl-based resin, a methacryl-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The anti-reflective panel 300 may be disposed on the sensor layer 200. The anti-reflective panel 300 reduces the reflectance of external light incident from above the window 400. In an embodiment of the inventive concept, the anti-reflective panel 300 may be omitted.

The window 400 may be disposed on the anti-reflective panel 300. The window 400 may include an optically transparent insulating material. For example, the window 400 may include glass or plastic. The window 400 may have a single- or multi-layered structure. For example, the window 400 may include a plurality of plastic films bonded with an adhesive, or a glass substrate and a plastic film which are bonded with an adhesive.

Figure 8A:
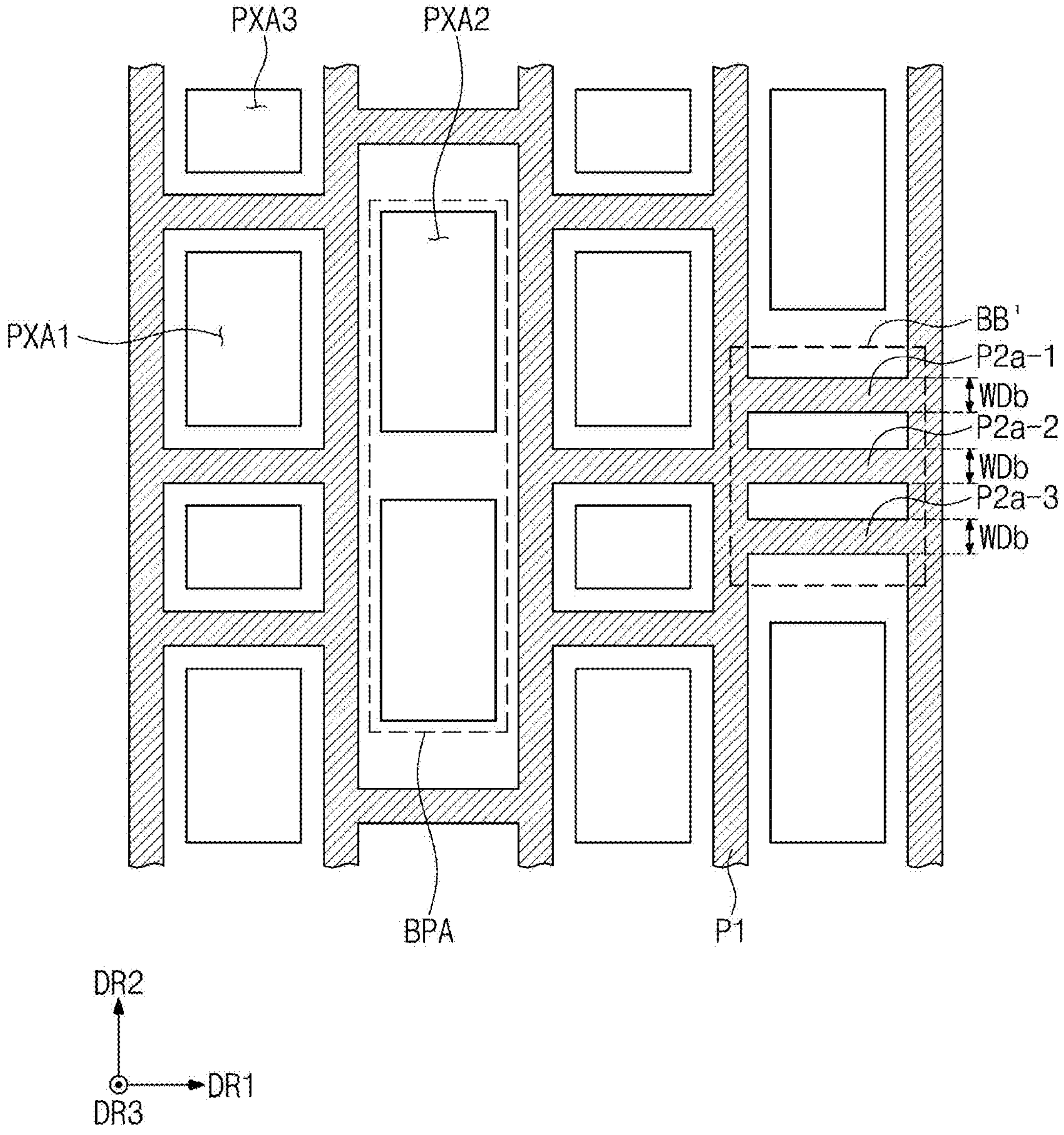
FIG. 8A is a plan view of an electronic device illustrating a region corresponding to region AA' of FIG. 1 according to an embodiment of the inventive concept.

FIG. 8A is a plan view of an electronic device illustrating a region corresponding to region AA' of FIG. 1 according to an embodiment of the inventive concept. In describing FIG. 8A, the same reference numerals or symbols are used for the components described with reference to FIG. 6, and thus, a description thereof may be omitted.

Referring to FIG. 8A, when seen on a plane, a plurality of second portions P2*a*-1, P2*a*-2, and P2*a*-3 may be disposed between a pixel group BPA and another pixel group BPA adjacent thereto. For example, the plurality of second portions P2*a*-1, P2*a*-2, and P2*a*-3 may be disposed between a pixel group BPA and another pixel group BPA that are adjacent to each other and arranged in the second direction DR2. The plurality of second portions P2*a*-1, P2*a*-2, and P2*a*-3 may be provided integrally with a first portion P1.

The plurality of second portions P2*a*-1, P2*a*-2, and P2*a*-3 may include a first sub portion P2*a*-1, a second sub portion P2*a*-2, and a third sub portion P2*a*-3. The first sub portion P2*a*-1, the second sub portion P2*a*-2, and the third sub portion P2*a*-3 may each extend in the first direction DR1. The first sub portion P2*a*-1, the second sub portion P2*a*-2, and the third sub portion P2*a*-3 may be arranged in the second direction DR2. FIG. 8A illustrates that the number of the second portions is three, but the number of the plurality of second portions according to an embodiment of the inventive concept is not limited thereto.

The first sub portion P2*a*-1, the second sub portion P2*a*-2, and the third sub portion P2*a*-3 may each have a second width WDb. The second width WDb may be about 3.5 μm to about 4.5 μm. For example, the second width WDb may be about 4 μm.

Unlike the inventive concept, if the distances between pixel-defining films 70 (see FIG. 7) and metal layers are not uniform, a user, who should see a white image at a specific point, may recognize the white image as a reddish white image. A phenomenon in which the amount of change in a color coordinate is large only at a specific point is referred to as a white wavelength shift or white angular dependency (WAD). Herein, a white image, wavelength-shifted to a long wavelength, is described as an example of the white wavelength shift, but the white wavelength shift is not limited thereto. Depending on the direction of change in a color coordinate, the white image may be recognized as a reddish white image, a bluish white image, or a greenish white image. However, according to an embodiment of the inventive concept, the second portion, which is a metal layer, may be provided in plural. The uniformity of distances between each of the first sub portion P2*a*-1, the second sub portion P2*a*-2, and the third sub portion P2*a*-3 and the pixel-defining films 70 (see FIG. 7) may be improved, compared to cases where the plurality of second portions P2*a*-1, P2*a*-2, and P2*a*-3 are not present. As a consequence, the WAD may be mitigated. Accordingly, the electronic device 1000 (see FIG. 1) with enhanced display performance may be provided.

Mutual capacitance between the plurality of first sensing electrodes TE1 (see FIG. 4) and the plurality of second sensing electrodes TE2 (see FIG. 4) may be about 441 fF to about 450 fF. For example, the mutual capacitance may be about 448 fF. The amount of change in the mutual capacitance may be about 38 fF to about 40 fF. For example, the amount of change may be about 38 fF.

According to an embodiment of the inventive concept, mutual capacitance between the plurality of first sensing electrodes TE1 (see FIG. 4) and the plurality of second sensing electrodes TE2 (see FIG. 4) which are each formed of the first portion P1 and the plurality of second portions P2*a*-1, P2*a*-2, and P2*a*-3 may increase. The amount of change in the mutual capacitance may be greater as the mutual capacitance becomes larger. Accordingly, the sensing sensitivity of the sensor layer 200 (see FIG. 1) may be improved.

Figure 8B:
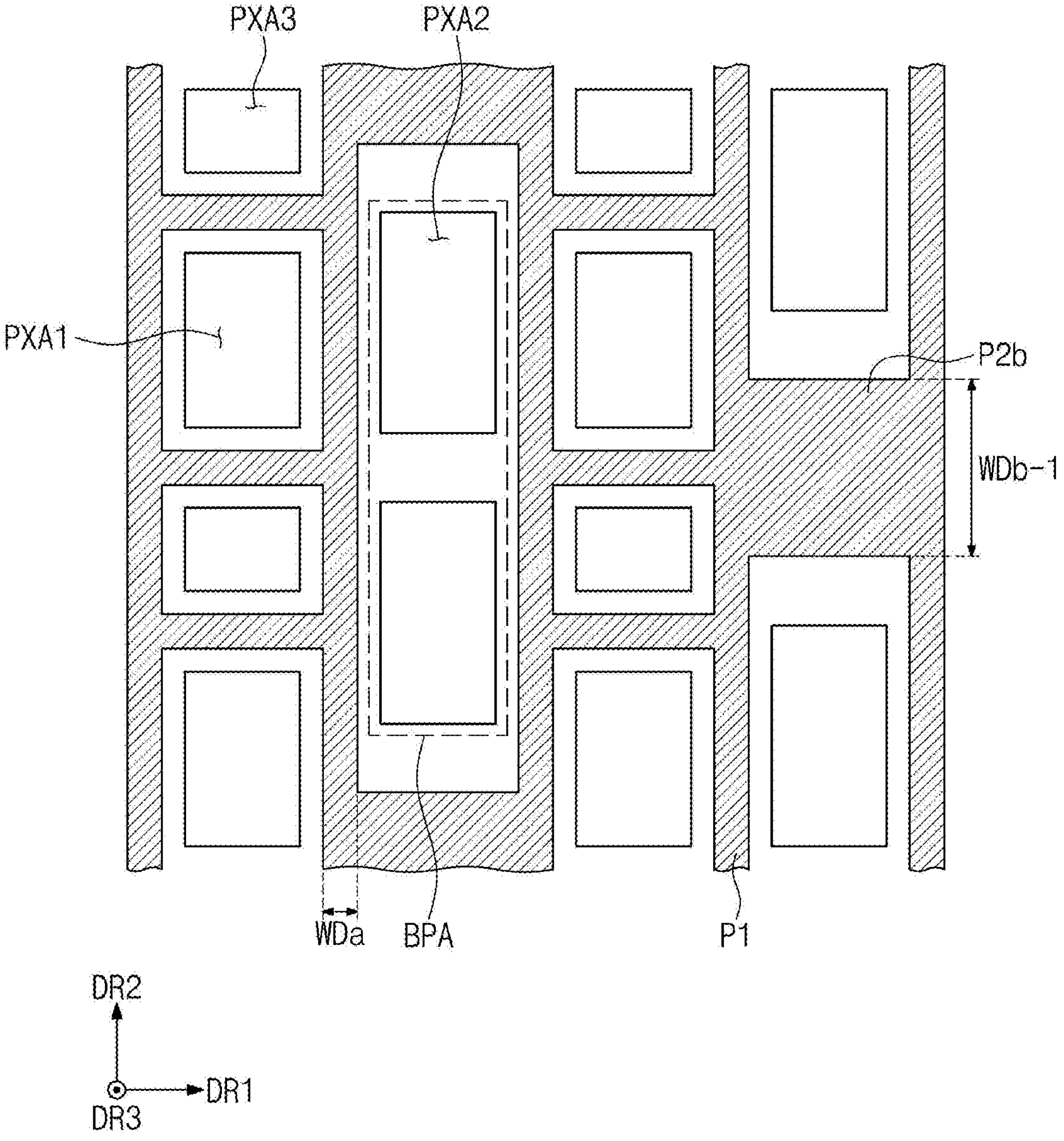
FIG. 8B is a plan view of an electronic device illustrating a region corresponding to region AA' of FIG. 1 according to an embodiment of the inventive concept.

FIG. 8B is a plan view of an electronic device illustrating a region corresponding to region AA' of FIG. 1 according to an embodiment of the inventive concept. In describing FIG. 8B, the same reference numerals or symbols are used for the components described with reference to FIG. 6, and thus, a description thereof may be omitted.

Referring to FIG. 8B, when seen on a plane, a second portion P2*b* may be disposed between a pixel group BPA and another pixel group BPA adjacent thereto. The second portion P2*b* may be provided integrally with the first portion P1.

The second portion P2*b* may extend in the second direction DR2.

The second portion P2*b* may have a second width WDb-1. The second width WDb-1 may be about 32 μm to about 34 μm. For example, the second width WDb-1 may be about 33 μm.

Mutual capacitance between the plurality of first sensing electrodes TE1 (see FIG. 4) and the plurality of second sensing electrodes TE2 (see FIG. 4) may be about 470 fF to about 480 fF. For example, the mutual capacitance may be about 476 fF. The amount of change in the mutual capacitance may be about 40 fF to about 45 fF. For example, the amount of change may be about 43 fF.

According to an embodiment of the inventive concept, mutual capacitance between the plurality of first sensing electrodes TE1 (see FIG. 4) and the plurality of second sensing electrodes TE2 (see FIG. 4) which are each formed of the first portion P1 and the second portion P2*b* may increase. The amount of change in the mutual capacitance may be greater as the mutual capacitance becomes larger. Accordingly, the sensing sensitivity of the sensor layer 200 (see FIG. 1) may be improved.

Figure 9A:
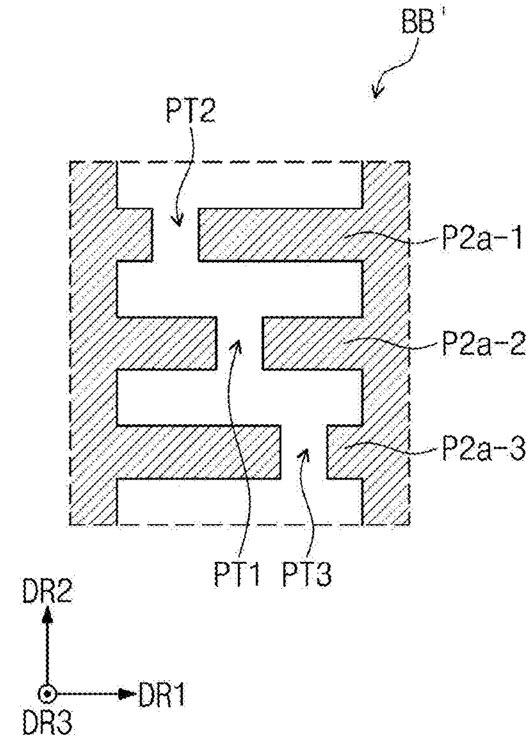
FIGS. 9A, 9B, 9C, 9D, 9E, 9F and 9G are plan views illustrating region BB' of FIG. 8A according to an embodiment of the inventive concept.

FIG. 9A is a plan view illustrating region BB' of FIG. 8A according to an embodiment of the inventive concept. In describing FIG. 9A, the same reference numerals or symbols are used for the components described with reference to FIG. 8A, and thus, a description thereof may be omitted.

Referring to FIG. 9A, a first pattern PT1 may be provided in the second sub portion P2*a*-2. The first pattern PT1 may be located in the center of the second sub portion P2*a*-2.

A second pattern PT2 may be provided in the first sub portion P2*a*-1. The second pattern PT2 may be located on a first side of the first sub portion P2*a*-1. For example, in FIG. 9A, the second pattern PT2 may be located on the left side of the first sub portion P2*a*-1.

A third pattern PT3 may be provided in the third sub portion P2*a*-3. The third pattern PT3 may be defined on a second side of the third sub portion P2*a*-3. For example, in FIG. 9A, the third pattern PT2 may be located on the right side of the third sub portion P2*a*-3.

When seen in the second direction DR2, the first pattern PT1, the second pattern PT2, and the third pattern PT3 may not overlap one another.

Figure 9B:
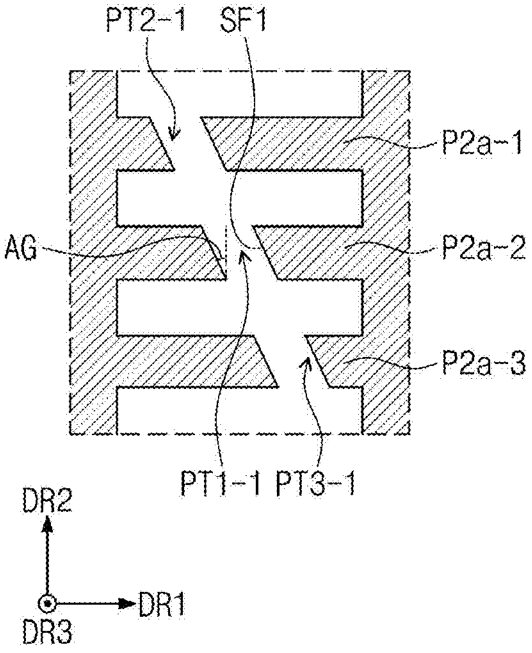

FIG. 9B is a plan view illustrating a region corresponding to region BB' of FIG. 8A according to an embodiment of the inventive concept. In describing FIG. 9B, the same reference numerals or symbols are used for the components described with reference to FIG. 8A, and thus, a description thereof may be omitted.

Referring to FIG. 9B, a first pattern PT1-1 may be provided in the second sub portion P2*a*-2. The first pattern PT1-1 may be located in the center of the second sub portion P2*a*-2.

A second pattern PT2-1 may be provided in the first sub portion P2a-1. The second pattern PT2-1 may be located on a first side of the first sub portion P2a-1.

A third pattern PT3-1 may be provided in the third sub portion P2a-3. The third pattern PT3-1 may be located on a second side of the third sub portion P2a-3.

When seen in the second direction DR2, the first pattern PT1-1, the second pattern PT2-1, and the third pattern PT3-1 may not overlap one another. However, a part of the first pattern PT1-1 may overlap a part of the second pattern PT2-1 in the second direction DR2, and a part of the second pattern PT2-1 may overlap a part of the third pattern PT3-1 in the second direction DR2.

One surface SF1 of the second sub portion P2a-2 in which the first pattern PT1-1 is provided may have a predetermined angle AG.

The first sub portion P2a-1 in which the second pattern PT2-1 is provided and the third sub portion P2a-3 in which the third pattern PT3-1 is provided may also have a pattern surface having the same angle as the predetermined angle AG.

Figure 9C:
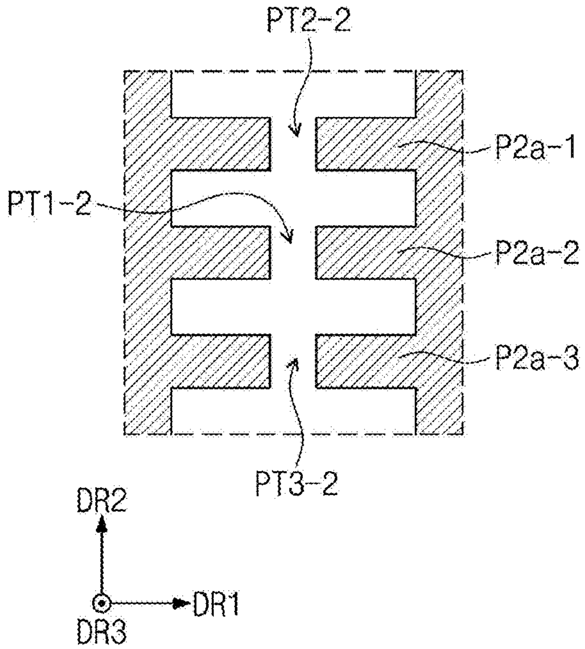

FIG. 9C is a plan view illustrating a region corresponding to region BB' of FIG. 8A according to an embodiment of the inventive concept. In describing FIG. 9C, the same reference numerals or symbols are used for the components described with reference to FIG. 8A, and thus, a description thereof may be omitted.

Referring to FIG. 9C, a first pattern PT1-2 may be provided in the second sub portion P2a-2. The first pattern PT1-2 may be located in the center of the second sub portion P2a-2.

A second pattern PT2-2 may be provided in the first sub portion P2a-1. The second pattern PT2-2 may be located in the center of the first sub portion P2a-1.

A third pattern PT3-2 may be provided in the third sub portion P2a-3. The third pattern PT3-2 may be located in the center of the third sub portion P2a-3.

When seen in the second direction DR2, the first pattern PT1-2, the second pattern PT2-2, and the third pattern PT3-2 may overlap one another. For example, the first pattern PT1-2, the second pattern PT2-2, and the third pattern PT3-2 may form a straight line in the second direction DR2.

Figure 9D:
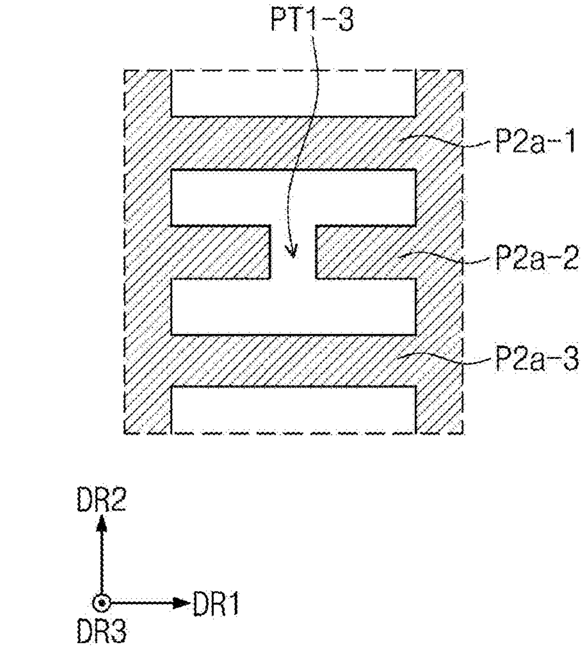

FIG. 9D is a plan view illustrating a region corresponding to region BB' of FIG. 8A according to an embodiment of the inventive concept. In describing FIG. 9D, the same reference numerals or symbols are used for the components described with reference to FIG. 8A, and thus, a description thereof may be omitted.

Referring to FIG. 9D, a first pattern PT1-3 may be provided in the second sub portion P2a-2. The first pattern PT1-3 may be located in the center of the second sub portion P2a-2.

Figure 9E:
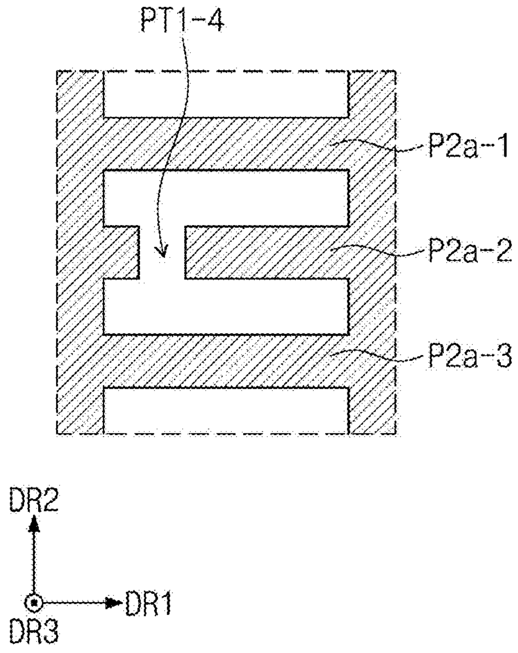

FIG. 9E is a plan view illustrating a region corresponding to region BB' of FIG. 8A according to an embodiment of the inventive concept. In describing FIG. 9E, the same reference numerals or symbols are used for the components described with reference to FIG. 8A, and thus, a description thereof may be omitted.

Referring to FIG. 9E, a first pattern PT1-4 may be provided in the second sub portion P2a-2. The first pattern PT1-4 may be located on one side of the second sub portion P2a-2. For example, the first pattern PT1-4 may be located closer to the side of the second sub portion P2a-2 having a smaller protruding part.

Figure 9F:
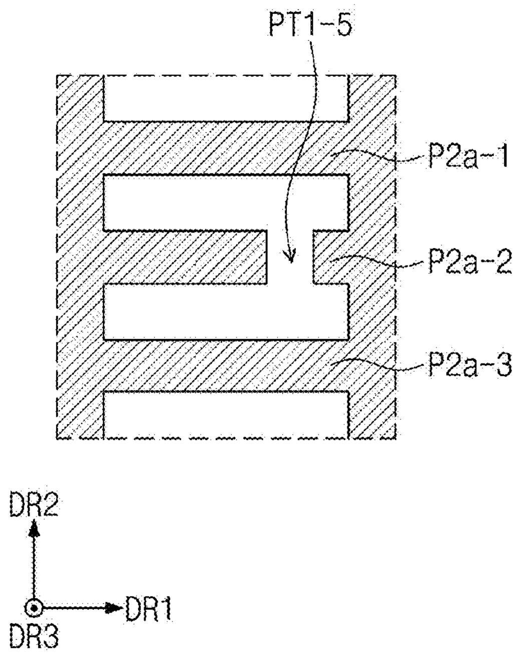

FIG. 9F is a plan view illustrating a region corresponding to region BB' of FIG. 8A according to an embodiment of the inventive concept. In describing FIG. 9F, the same reference numerals or symbols are used for the components described with reference to FIG. 8A, and thus, a description thereof may be omitted.

Referring to FIG. 9F, a first pattern PT1-5 may be provided in the second sub portion P2a-2. The first pattern PT1-5 may be located on the other side of the second sub portion P2a-2. In other words, the first pattern PT1-5 may be provided in a place spaced apart from the first pattern PT1-4 of FIG. 9E in the first direction DR1.

Figure 9G:
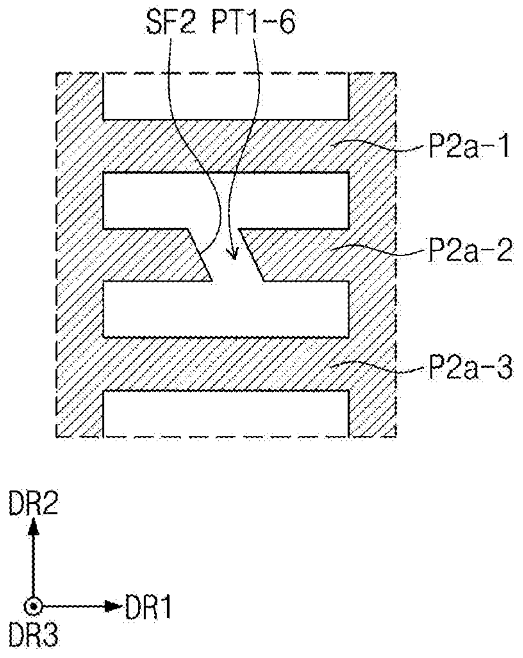

FIG. 9G is a plan view illustrating a region corresponding to region BB' of FIG. 8A according to an embodiment of the inventive concept. In describing FIG. 9G, the same reference numerals or symbols are used for the components described with reference to FIG. 8A, and thus, a description thereof will be omitted.

Referring to FIG. 9G, a first pattern PT1-6 may be provided in the second sub portion P2a-2. The first pattern PT1-6 may be located in the center of the second sub portion P2a-2.

One surface SF2 of the second sub portion P2a-2 in which the first pattern PT1-6 is defined may have a predetermined angle.

According to an embodiment of the inventive concept, at least one pattern provided in the second portions P2a-1, P2a-2, and P2a-3 may be variously formed. The shape of the sensing electrode SP may be variously provided through the pattern. For example, the sensing electrode SP having a diamond shape in FIG. 4 may be provided through the pattern. In addition, the shape of the pattern may be differently formed depending on each of the plurality of first sensing electrodes TE1 (see FIG. 4), the plurality of second sensing electrodes TE2 (see FIG. 4), and the dummy electrode DE (see FIG. 4) and the observation of the pattern shape make it possible to easily distinguish each of the plurality of first sensing electrodes TE1 (see FIG. 4), the plurality of second sensing electrodes TE2 (see FIG. 4), and the dummy electrode DE (see FIG. 4).

Figure 10:
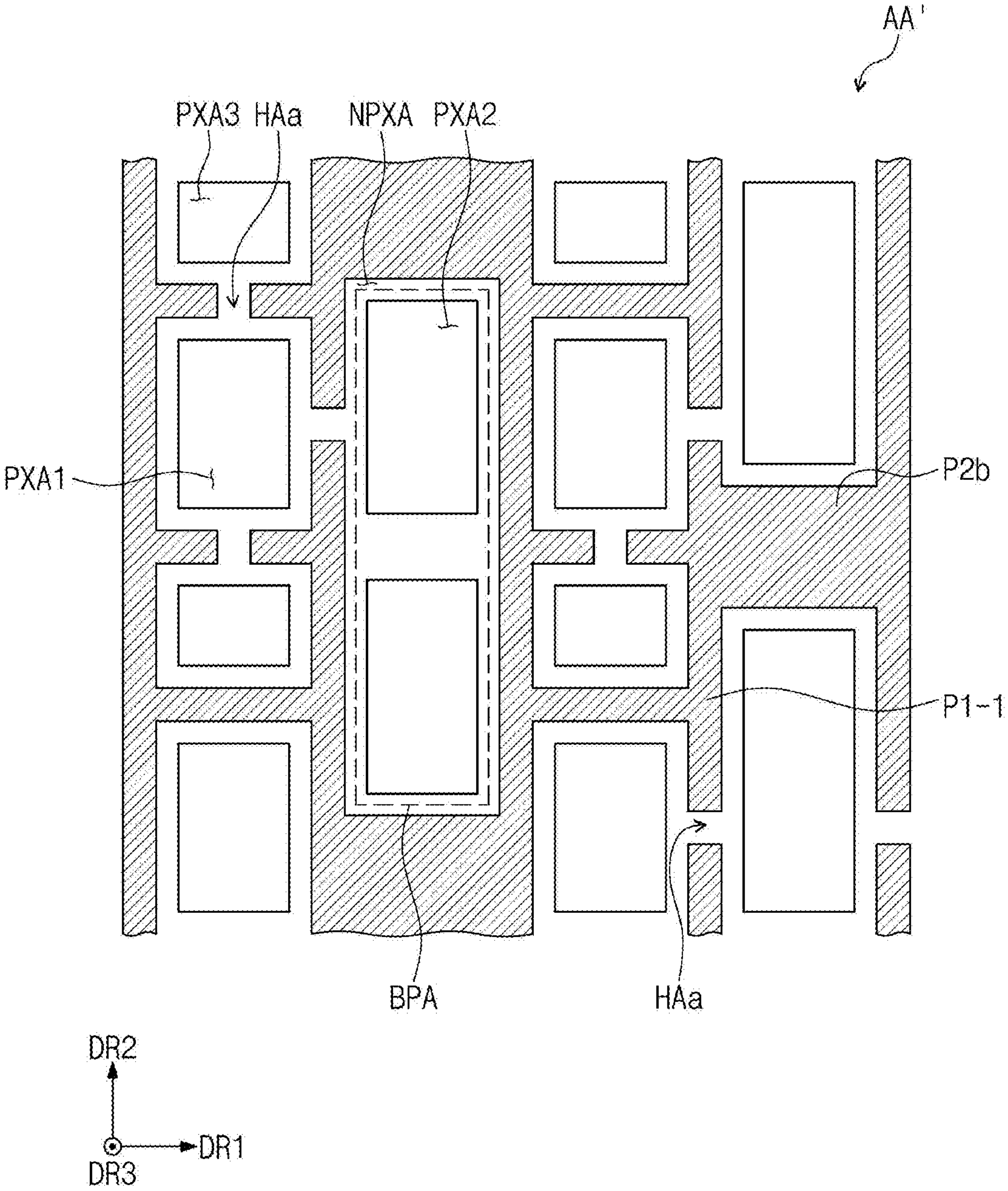
FIG. 10 is a plan view illustrating a region corresponding to region AA' of FIG. 1 according to an embodiment of the inventive concept.

FIG. 10 is a plan view illustrating a region corresponding to region AA' of FIG. 1 according to an embodiment of the inventive concept. In describing FIG. 10, the same reference numerals or symbols are used for the components described with reference to FIG. 8B, and thus, a description thereof may be omitted.

Referring to FIG. 10, at least one opening HAa may be provided in a first portion P1-1. The first portion P1-1 may be electrically connected to the second portion P2b. The first portion P1-1 may be provided integrally with the second portion P2b.

FIG. 10 illustrates the opening HAa in which a cutting surface does not have a predetermined angle, but the opening HAa according to an embodiment of the inventive concept is not limited thereto. For example, the opening HAa may have a cutting surface with a predetermined angle like the first pattern PT1-6 (see FIG. 9G) in the embodiment of FIG. 9G.

According to an embodiment of the inventive concept, the opening HAa may be provided in plural. The plurality of openings HAa may be formed in different places of each of the plurality of sensing electrodes SP (see FIG. 4). The plurality of openings HAa may reduce a phenomenon in which the plurality of sensing electrodes SP (see FIG. 4) are viewed from the outside. Accordingly, the electronic device 1000 (see FIG. 1) with enhanced display performance may be provided.

Figure 11:
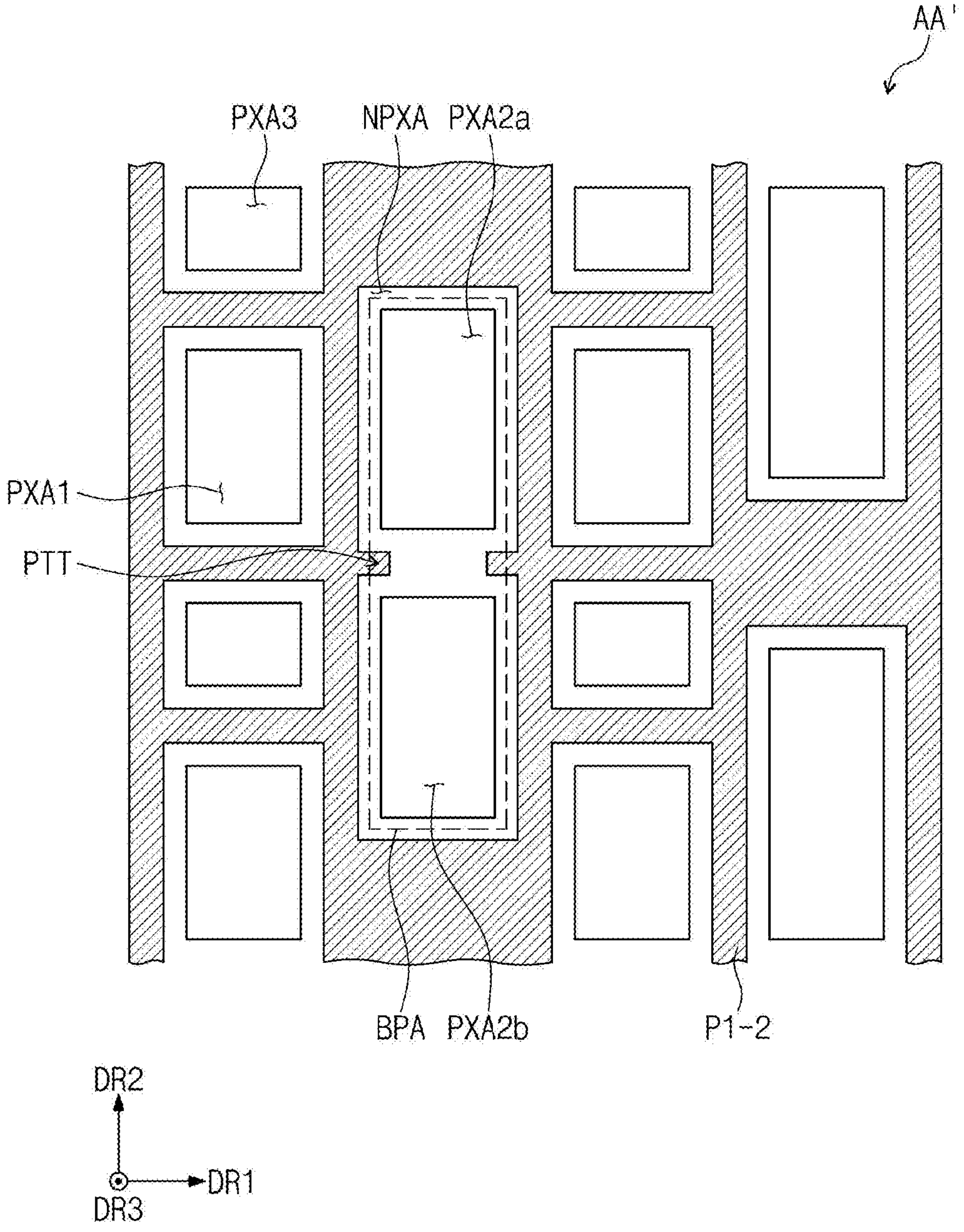
FIG. 11 is a plan view illustrating a region corresponding to region AA' of FIG. 1 according to an embodiment of the inventive concept.

FIG. 11 is a plan view illustrating a region corresponding to region AA' of FIG. 1 according to an embodiment of the inventive concept. In describing FIG. 11, the same reference numerals or symbols are used for the components described with reference to FIG. 8B, and thus, a description thereof may be omitted.

Referring to FIG. 11, the sensing electrode SP (see FIG. 4) may include a plurality of protrusions PTT. When seen on a plane, the plurality of protrusions PTT may be disposed in two adjacent second pixel regions PXA2*a* and PXA2*b*, and may protrude from a first portion P1-2 in the second direction DR2.

When seen on a plane, the plurality of protrusions PTT may overlap the pixel group BPA.

According to an embodiment of the inventive concept, the plurality of protrusions PTT may sense a touch between two adjacent second pixel regions PXA2*a* and PXA2*b*. Accordingly, the electronic device 1000 (see FIG. 1) with enhanced sensing sensitivity may be provided.

Figure 12:
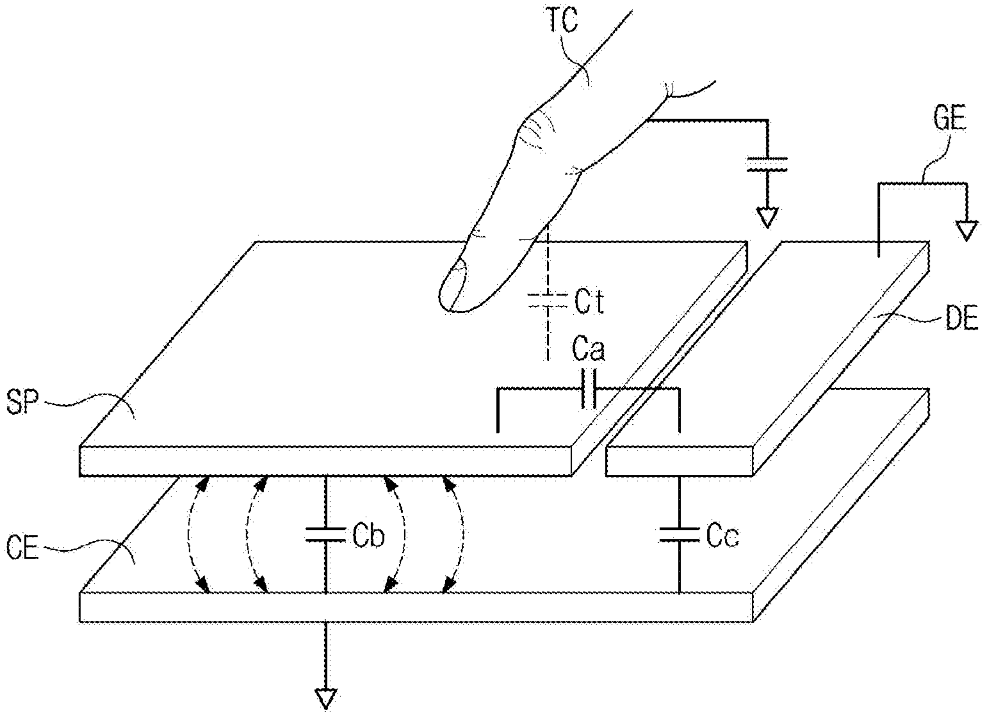
FIG. 12 is a block diagram of an electronic device according to an embodiment of the inventive concept.

FIG. 12 is a block diagram of an electronic device according to an embodiment of the inventive concept.

Referring to FIG. 12, the sensing electrode SP may be spaced apart by a predetermined distance from the common electrode CE of the display layer 100 (see FIG. 1) in the third direction DR3.

A first parasitic capacitor Cb may be formed between the sensing electrode SP and the common electrode CE.

A second parasitic capacitor Cc may be formed between the dummy electrode DE and the common electrode CE. The dummy electrode DE may be electrically connected to a ground electrode GE.

A third parasitic capacitor Ca may be formed between the dummy electrode DE and the sensing electrode SP.

When an external input TC is in contact with or close to the sensor layer 200 (see FIG. 1), a sensing capacitor Ct may be formed between the external input TC and the sensing electrodes SP. The electronic device 1000 (see FIG. 1) may determine whether the external input TC is touched or not, and a touch location, on the basis of the amount of change in the capacitance of the sensing capacitor Ct.

According to an embodiment of the inventive concept, a first noise signal generated in the common electrode CE may be transferred to the dummy electrode DE through the second parasitic capacitor Cc. The first noise signal transferred to the dummy electrode DE may be removed through the ground electrode GE. In addition, a second noise signal which is generated in the dummy electrode DE may be removed through the ground electrode GE. Accordingly, the external input TC may be sensed based on the amount of change in the capacitance of the sensing capacitor Ct of which the noise has been reduced or removed. Accordingly, the electronic device 1000 (see FIG. 1) with enhanced sensing sensitivity may be provided.

Figure 13:
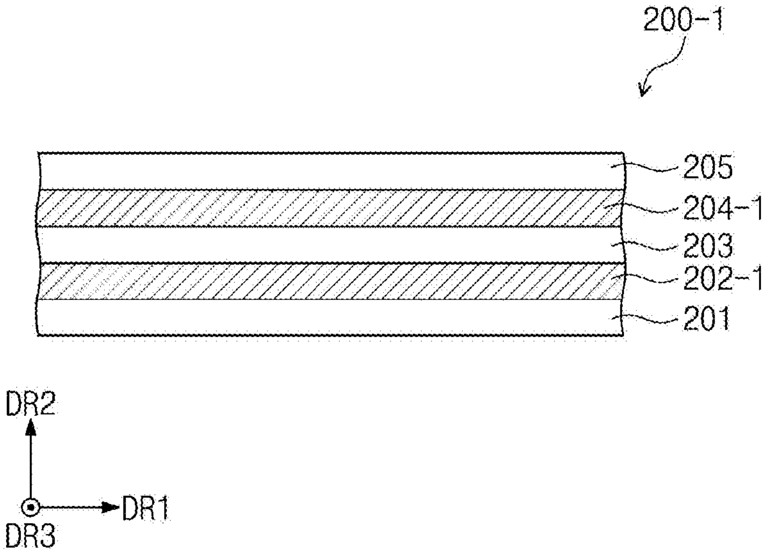
FIG. 13 is a cross-sectional view illustrating a sensor layer according to an embodiment of the inventive concept.
Figure 14A:
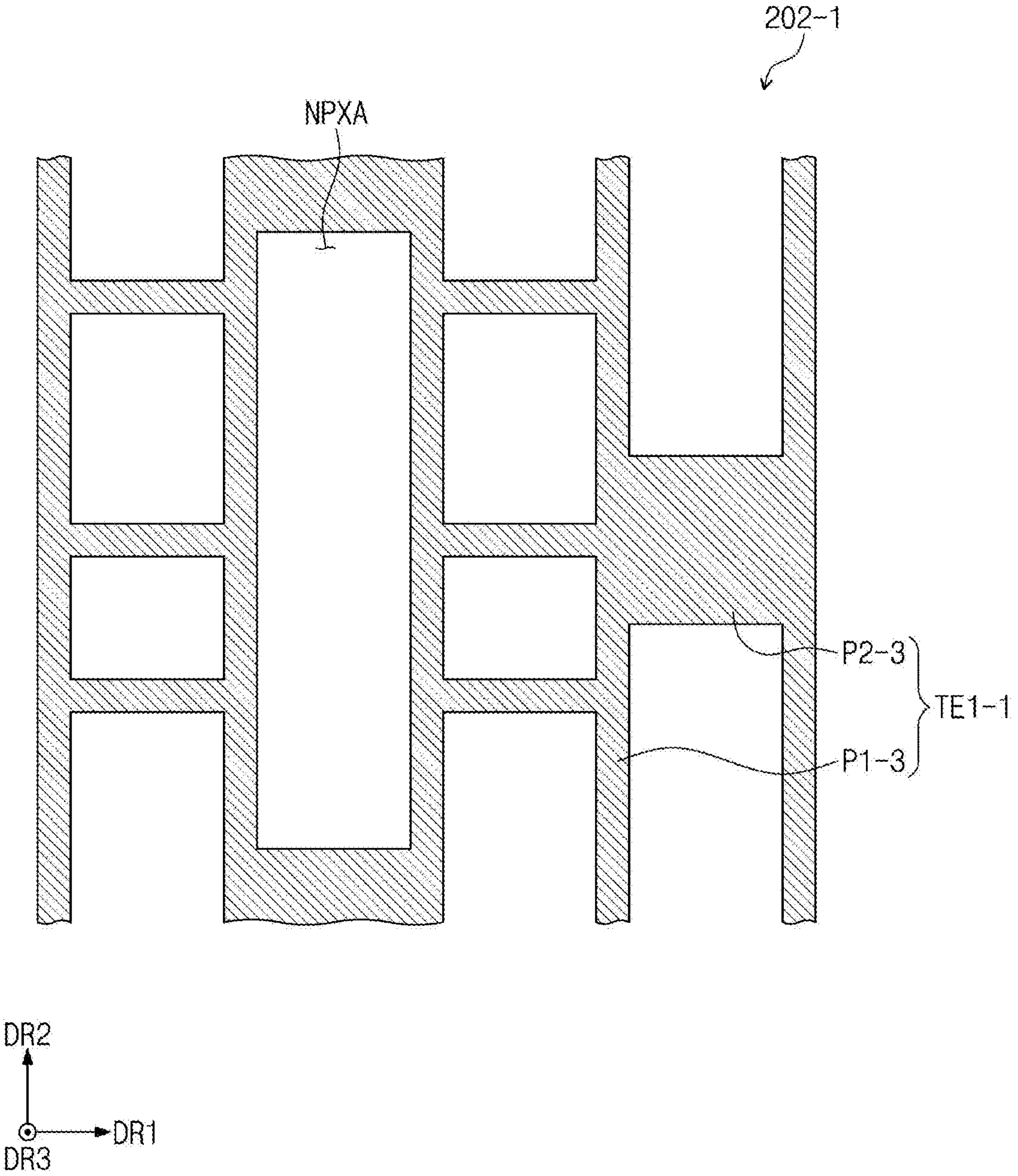
FIG. 14A is a plan view illustrating a first conductive layer according to an embodiment of the inventive concept.
Figure 14B:
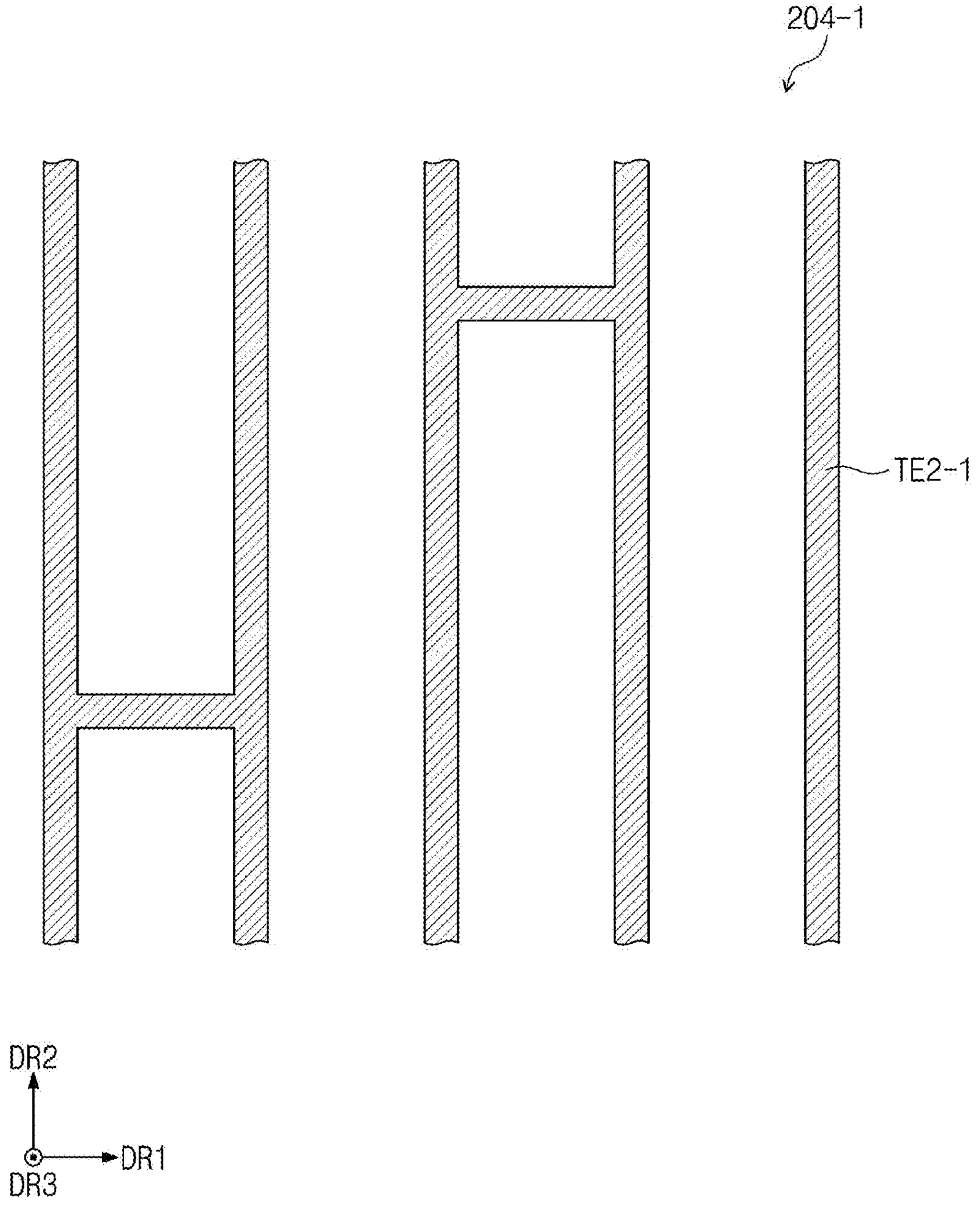
FIG. 14B is a plan view illustrating a second conductive layer according to an embodiment of the inventive concept.
Figure 15:
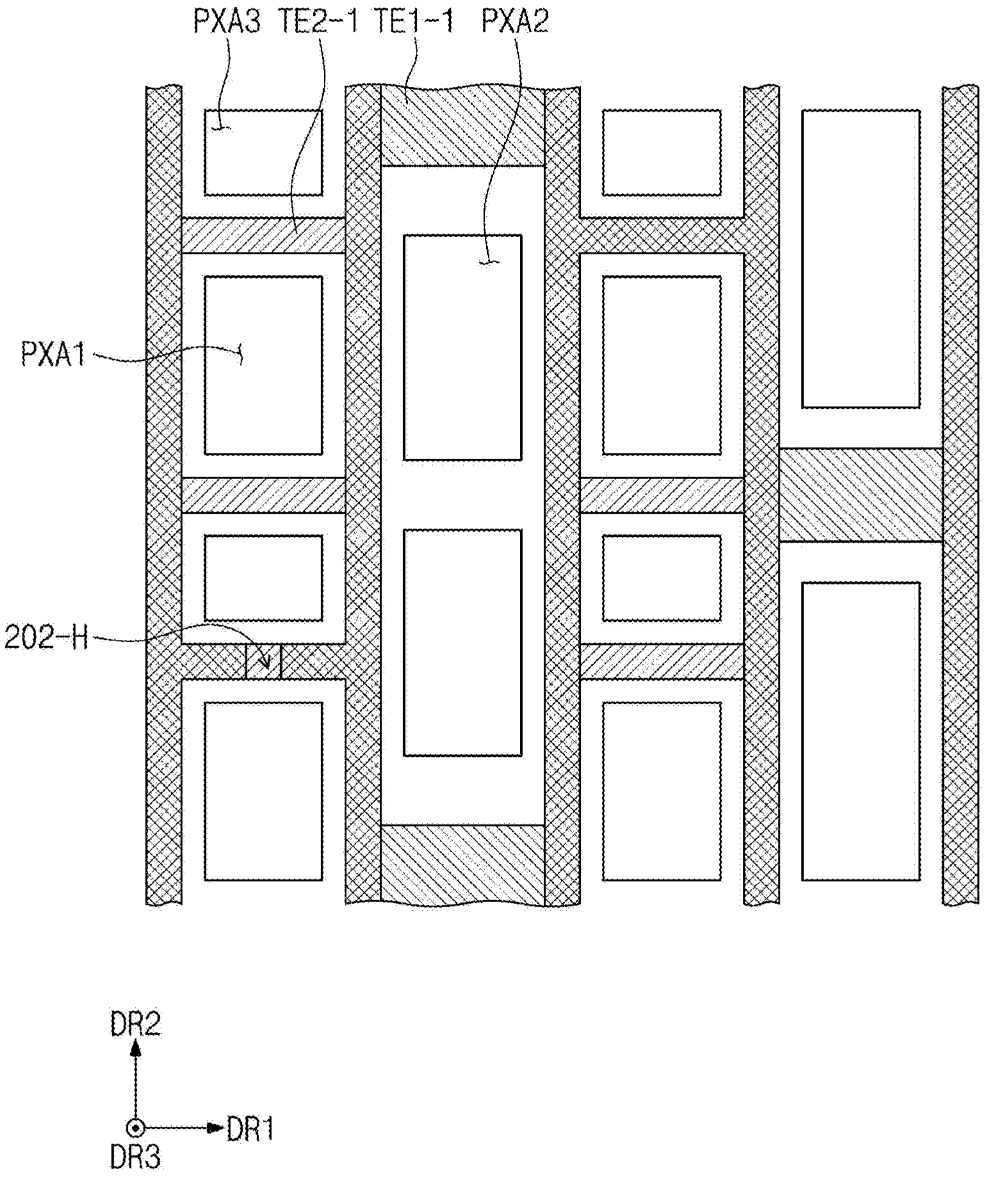
FIG. 15 is a plan view illustrating a region corresponding to region AA' of FIG. 1 according to an embodiment of the inventive concept.

FIG. 13 is a cross-sectional view illustrating a sensor layer according to an embodiment of the inventive concept, FIG. 14A is a plan view illustrating a first conductive layer according to an embodiment of the inventive concept, FIG. 14B is a plan view illustrating a second conductive layer according to an embodiment of the inventive concept, and FIG. 15 is a plan view illustrating a region corresponding to region AA' of FIG. 1 according to an embodiment of the inventive concept. In describing FIG. 13, the same reference numerals or symbols are used for the components described with reference to FIG. 7, and thus, a description thereof may be omitted.

Referring to FIGS. 13 to 15, a sensor layer 200-1 may include a base layer 201, a first conductive layer 202-1, a sensing insulating layer 203, a second conductive layer 204-1, and a cover insulating layer 205.

The first conductive layer 202-1 may be disposed on the base layer 201. The first conductive layer 202-1 may include a first sensing electrode TE1-1. The sensing insulating layer 203 may be disposed on the first conductive layer 202-1.

The first sensing electrode TE1-1 may include a first portion P1-3 and a second portion P2-3.

The first portion P1-3 may be disposed adjacent to the plurality of first pixel regions PXA1 and the plurality of third pixel regions PXA3. The first portion P1-3 may surround the plurality of first pixel regions PXA1 and the plurality of third pixel regions PXA3.

When seen on a plane, the second portion P2-3 may extend in the first direction DR1 between a pixel group BPA and another pixel group BPA adjacent thereto. The second portion P2-3 may be provided integrally with the first portion P1-3.

The second conductive layer 204-1 may be disposed on the sensing insulating layer 203. The second conductive layer 204-1 may include a second sensing electrode TE2-1.

The second sensing electrode TE2-1 may be disposed adjacent to the plurality of first pixel regions PXA1 and the plurality of third pixel regions PXA3.

When seen on a plane, an opening 202-H overlapping the second sensing electrode TE2-1 may be provided in the first portion P1-3. The opening 202-H may be provided in plural.

A plurality of openings 202-H may reduce the area in which the first sensing electrodes TE1-1 and the second sensing electrodes TE2-1 overlap. The plurality of openings 202-H may prevent the occurrence of excessive capacitance between the first sensing electrode TE1-1 and the second sensing electrode TE2-1. Mutual capacitance between the first sensing electrode TE1-1 and the second sensing electrode TE2-1 may be controlled by the plurality of openings 202-H, and the sensor layer 200 may sense an external input on the basis of the amount of change in the mutual capacitance. Accordingly, the electronic device 1000 (see FIG. 1) with enhanced sensing sensitivity may be provided.

According to embodiments of the inventive concept described above, due to a second portion formed between pixel groups adjacent to each other, a mutual capacitance between a plurality of first sensing electrodes and a plurality of second sensing electrodes which are each composed of a first portion and a second portion may increase. The amount of a change in the mutual capacitance may be greater as the mutual capacitance becomes larger. Accordingly, sensing sensitivity of a sensor layer may be enhanced.

In addition, according to embodiments of the inventive concept described above, due to second portions formed between pixel groups adjacent to each other, uniformity in distances between pixel-defining films and the second portions, which are metal layers, may be improved. The white angular dependency (WAD) may thus be mitigated. Accordingly, an electronic device with improved display performance may be provided.

In the above, a description has been made with reference to embodiments of the inventive concept, but those skilled in the art or those of ordinary skill in the relevant technical field may understand that various modifications and changes may be made to the inventive concept within the scope of the inventive concept as described in the claims. Therefore, the scope of the inventive concept is not limited to the contents described in the detailed description of the specification.

What is claimed is:

1. An electronic device comprising:

a display layer; and a sensor layer disposed on the display layer, and including a sensing electrode, wherein the display layer comprises:

a plurality of first pixels defining a plurality of first pixel areas, respectively, a plurality of second pixels spaced apart from the plurality of first pixels in a first direction, and defining a plurality of second pixel areas, respectively, and a plurality of third pixels alternately arranged with the plurality of first pixels along a second direction crossing the first direction, and defining a plurality of third pixel areas, respectively, wherein the sensing electrode is defined with a plurality of first openings overlapping with the plurality of first pixel areas respectively, a plurality of second openings overlapping with the plurality of second pixel areas respectively, and a plurality of third openings overlapping with the plurality of third pixels respectively, wherein the sensing electrode comprises, a first portion disposed between one of the plurality of first pixels and one of the plurality of third pixels adjacent to each other; and a second portion arranged between two of the plurality of second pixels adjacent to each other, wherein the first portion has a constant first width in the second direction along its entirety, wherein the second portion has a constant second width in the second direction along its entirety, and wherein the second width is greater than the first width.

2. The electronic device of claim 1, wherein a ratio of the second width to the first width is 7.5 or more and 9.15 or less.

3. The electronic device of claim 1, wherein, when viewed on a plane, the sensing electrode does not overlap the first pixels, the second pixels, and the third pixels.

4. The electronic device of claim 1, wherein, when viewed on a plane, two adjacent second openings among the plurality of second openings are connected to each other.

5. The electronic device of claim 1, wherein one of the plurality of first openings is connected to an adjacent one of the plurality of third openings in the second direction, and the one of the plurality of third openings is connected to one of the plurality of second openings in the first direction.

6. The electronic device of claim 5, wherein the one of the plurality of first openings, the one of the plurality of second openings, and the one of the plurality of third openings are connected to each other.

7. The electronic device of claim 1, wherein the display layer defines, a first area extending in the second direction and having one of the plurality of first pixels, one of the plurality of second pixels, and one of the plurality of third pixels disposed; and a second area spaced apart in the first direction and extending in the second direction and having another of the plurality of first pixels, another of the plurality of second pixels, and another of the plurality of third pixels disposed.

8. The electronic device of claim 7, wherein when viewed on a plane, a first shape of the sensing electrode overlapping the first area and a second shape of the sensing electrode overlapping the second area are different from each other.

9. An electronic device comprising:

a display layer, and a sensor layer disposed on the display layer, and including a sensing electrode, wherein the display layer comprises:

a plurality of first pixels defining a plurality of first pixel areas, respectively, a plurality of second pixels spaced apart from the plurality of first pixels in a first direction, and defining a plurality of second pixel areas, respectively, and a plurality of third pixels alternately arranged with the plurality of first pixels along a second direction crossing the first direction, and defining a plurality of third pixel areas, respectively, wherein the sensing electrode is defined with a plurality of first openings overlapping with the plurality of first pixel areas respectively, a plurality of second openings overlapping with the plurality of second pixel areas respectively, and a plurality of third openings overlapping with the plurality of third pixels respectively, and wherein one of the plurality of first openings is connected to an adjacent one of the plurality of third openings in the second direction, that one of the plurality of third openings not being connected to any other openings, and the one of the plurality of first openings is also connected to one of the plurality of second openings in the first direction, that one of the plurality of second openings not being connected to any other openings.

10. The electronic device of claim 9, wherein the one of the plurality of first openings, the one of the plurality of second openings, and the one of the plurality of third openings are connected to each other.

11. The electronic device of claim 9, wherein, when viewed on a plane, the sensing electrode does not overlap the first pixels, the second pixels, and the third pixels.

12. The electronic device of claim 9, wherein, when viewed on a plane, two adjacent second openings among the plurality of second openings are connected to each other.

13. The electronic device of claim 9, wherein the display layer defines, a first area extending in the second direction and having one of the plurality of first pixels, one of the plurality of second pixels, and one of the plurality of third pixels disposed; and a second area spaced apart in the first direction and extending in the second direction and having another of the plurality of first pixels, another of the plurality of second pixels, and another of the plurality of third pixels disposed.

14. The electronic device of claim 13, wherein when viewed on a plane, a first shape of the sensing electrode overlapping the first area and a second shape of the sensing electrode overlapping the second area are different from each other.

15. An electronic device comprising:

a display layer; and a sensor layer disposed on the display layer, and including a sensing electrode, wherein the display layer comprises:

a plurality of first pixels defining a plurality of first pixel areas, respectively, a plurality of second pixels spaced apart from the plurality of first pixels in a first direction, and defining a plurality of second pixel areas, respectively, and a plurality of third pixels alternately arranged with the plurality of first pixels along a second direction crossing the first direction, and defining a plurality of third pixel areas, respectively, wherein the display layer defines, a first area extending in the second direction and having one of the plurality of first pixels, one of the plurality of second pixels, and one of the plurality of third pixels disposed; and a second area spaced apart in the first direction and extending in the second direction and having another of the plurality of first pixels, another of the plurality of second pixels, and another of the plurality of third pixels disposed, and wherein when viewed on a plane, a first shape of the sensing electrode overlapping the first area and a second shape of the sensing electrode overlapping the second area are different from each other and also a shape of the first area of the display layer overlapped by the first shape of the sensing electrode is different from a shape of the second area of the display layer overlapped by the second shape of the sensing electrode.

16. The electronic device of claim 15, wherein the sensing electrode is defined with a plurality of first openings overlapping with the plurality of first pixel areas respectively, a plurality of second openings overlapping with the plurality of second pixel areas respectively, and a plurality of third openings overlapping with the plurality of third pixels respectively, and wherein one of the plurality of first openings is connected to an adjacent one of the plurality of third openings in the second direction, and the one of the plurality of third openings is connected to one of the plurality of second openings in the first direction.

17. The electronic device of claim 16, wherein the one of the plurality of first openings, the one of the plurality of second openings, and the one of the plurality of third openings are connected to each other.

18. The electronic device of claim 16, wherein, when viewed on the plane, two adjacent second openings among the plurality of second openings are connected to each other.

19. The electronic device of claim 15, wherein, when viewed on the plane, the sensing electrode does not overlap the first pixels, the second pixels, and the third pixels.

* * * * *